US012618411B1

(12) United States Patent
Yang et al.

(10) Patent No.: US 12,618,411 B1
(45) Date of Patent: May 5, 2026

(54) OIL PUMP

(71) Applicant: Zhuhai Pristar Technology Co., Ltd.,
Zhuhai City (CN)

(72) Inventors: Zeng Yang, Zhuhai (CN); Haihua Pan,
Zhuhai City (CN); Guohui Chen,
Zhuhai City (CN)

(73) Assignee: Zhuhai Pristar Technology Co., Ltd.,
Zhuhai City (CN)

( * ) Notice: Subject to any disclaimer, the term of this
patent is extended or adjusted under 35
U.S.C. 154(b) by 0 days.

(21) Appl. No.: 19/177,750

(22) Filed: Apr. 14, 2025

(30) Foreign Application Priority Data

Apr. 3, 2025 (CN) .......................... 202520630624.5

(51) Int. Cl.
| | |
|---|---|
| *F04D 25/06* | (2006.01) |
| *B60R 16/023* | (2006.01) |
| *B60R 16/033* | (2006.01) |
| *F04D 29/08* | (2006.01) |
| *F04D 29/40* | (2006.01) |
| *G01F 23/292* | (2006.01) |
| *G01R 31/3835* | (2019.01) |
| *G07C 5/08* | (2006.01) |
| *H02K 21/16* | (2006.01) |

(52) U.S. Cl.
CPC .......... *F04D 25/06* (2013.01); *B60R 16/0231*
(2013.01); *B60R 16/033* (2013.01); *F04D
29/086* (2013.01); *F04D 29/406* (2013.01);
*G01F 23/292* (2013.01); *G01R 31/3835*
(2019.01); *G07C 5/0825* (2013.01); *H02K
21/16* (2013.01)

(58) Field of Classification Search
CPC ........ F04D 13/06; F04D 25/06; F04D 29/086;
F04D 29/406; F04D 29/5806; F04D
13/0626; F04D 13/0646; F04D 29/528;
F04D 29/548; F04D 3/00; F04D 7/04
See application file for complete search history.

(56) References Cited

U.S. PATENT DOCUMENTS

| | | | | | |
|---|---|---|---|---|---|
| 5,795,478 | A | * | 8/1998 | Hirs ................... | B01D 21/2405 |
| | | | | | 210/DIG. 5 |
| 2005/0244287 | A1 | * | 11/2005 | Dobrynski .............. | F04B 17/03 |
| | | | | | 417/423.3 |
| 2011/0095714 | A1 | * | 4/2011 | Kagawa ................... | F01C 20/00 |
| | | | | | 318/400.21 |
| 2017/0261004 | A1 | * | 9/2017 | Hofstad ................. | F04D 13/12 |
| 2019/0103793 | A1 | * | 4/2019 | Walsh .................. | H02K 16/025 |
| 2021/0108641 | A1 | * | 4/2021 | Arkwright ............ | F04D 29/605 |

(Continued)

*Primary Examiner* — Dominick L Plakkoottam

(57) ABSTRACT

An oil pump includes an oil outlet part, a hollow oil
conveying pipeline, an oil pumping part, and a sealing part.
An oil outlet opening is defined in the oil outlet part. The oil
conveying pipeline is provided with a first liquid channel. A
first oil pumping opening is defined in the oil pumping part.
The oil pumping part is connected to the oil outlet part
through the oil conveying pipeline. The oil pumping part, the
oil conveying pipeline, and the oil outlet part are in com-
munication with each other. The oil pumping part is pro-
vided with an oil pumping housing and a driving motor. The
driving motor is positioned inside the oil pumping housing.
The driving motor is connected to the oil pumping housing.
The driving motor is a brushless motor. The sealing part is
configured for sealing and covering the first opening to seal
the first installation cavity.

19 Claims, 21 Drawing Sheets

(56) References Cited

U.S. PATENT DOCUMENTS

| | | | |
|---|---|---|---|
| 2021/0355965 A1* | 11/2021 | De Raeve | F04D 29/66 |
| 2022/0056909 A1* | 2/2022 | Reynolds | F04D 13/06 |
| 2022/0120293 A1* | 4/2022 | Henton | F04D 13/08 |
| 2022/0252070 A1* | 8/2022 | Brunvold | H02K 1/20 |
| 2024/0063732 A1* | 2/2024 | Nair | H02P 21/22 |
| 2025/0129787 A1* | 4/2025 | Kawasaki | F04D 13/0646 |
| 2025/0257731 A1* | 8/2025 | O'Sullivan | F04D 7/04 |
| 2025/0297611 A1* | 9/2025 | Lindsey | F04D 13/068 |

* cited by examiner

OIL PUMP

CROSS-REFERENCE TO RELATED APPLICATIONS

The application claims priority of Chinese patent application CN2025206306245, filed on Apr. 3, 2025, which is incorporated herein by reference in its entireties.

TECHNICAL FIELD

The present invention relates to the field of fuel pumps, particularly to an oil pump.

BACKGROUND ART

Currently, due to the limited space of vehicle's fuel tanks, vehicles require refueling after traveling certain distances. However, in remote areas where gas stations are scarce and located far apart, users typically carry fuel-containing barrels in their vehicles to enable timely refueling of the vehicle's fuel tank. Nevertheless, the substantial volume of these barrels makes it difficult to directly pour the fuel from the barrels into the vehicle's fuel tank. Consequently, there is an urgent market demand for an oil pump that facilitates the transfer of fuel from the barrels to the vehicle's fuel tanks.

SUMMARY

In order to overcome the shortcomings of the prior art, the present invention provides an oil pump. The oil pump includes:

an oil outlet part, wherein an oil outlet opening is defined in the oil outlet part;

a hollow oil conveying pipeline, wherein the oil conveying pipeline is provided with a first liquid channel;

an oil pumping part, wherein a first oil pumping opening is defined in the oil pumping part; the oil pumping part is connected to the oil outlet part through the oil conveying pipeline, and the oil pumping part, the oil conveying pipeline, and the oil outlet part are in communication with each other; the oil pumping part is provided with an oil pumping housing and a driving motor, the driving motor is positioned inside the oil pumping housing, the driving motor is connected to the oil pumping housing, and the driving motor is used for driving oil to pass through the first oil pumping opening, the first liquid channel, and the oil outlet opening in sequence and flow out through the oil outlet opening; the driving motor is a brushless motor, the brushless motor includes a motor housing, a stator winding part, and a permanent magnet rotor part, the motor housing is provided with a partition part, and the partition part is configured for dividing the motor housing into a first installation cavity and a second installation cavity; a first opening is defined in the first installation cavity, a second opening is defined in the second installation cavity, the stator winding part is installed in the first installation cavity through the first opening, and the permanent magnet rotor part is installed in the second installation cavity through the second opening; and a sealing part, wherein the sealing part is configured for sealing and covering the first opening to seal the first installation cavity.

Beneficial effects of the present invention are as follows. The present invention provides an oil pump. The oil pump includes the oil outlet part, the hollow oil conveying pipeline, the oil pumping part, and the sealing part. The oil outlet opening is defined in the oil outlet part. The oil conveying pipeline is provided with the first liquid channel. The first oil pumping opening is defined in the oil pumping part. The oil pumping part is connected to the oil outlet part through the oil conveying pipeline. The oil pumping part, the oil conveying pipeline, and the oil outlet part are in communication with each other. The oil pumping part is provided with the oil pumping housing and the driving motor. The driving motor is positioned inside the oil pumping housing. The driving motor is connected to the oil pumping housing. The driving motor is used for driving the oil to pass through the first oil pumping opening, the first liquid channel, and the oil outlet opening in sequence and flow out through the oil outlet opening. The driving motor is the brushless motor. The brushless motor includes the motor housing, the stator winding part, and the permanent magnet rotor part. The motor housing is provided with the partition part. The partition part is configured for dividing the motor housing into the first installation cavity and the second installation cavity. The first opening is defined in the first installation cavity. The second opening is defined in the second installation cavity. The stator winding part is installed in the first installation cavity through the first opening. The permanent magnet rotor part is installed in the second installation cavity through the second opening. The sealing part is configured for sealing and covering the first opening to seal the first installation cavity. Therefore, the brushless motor is capable of driving the oil in an oil tank to flow through the first oil pumping opening, the first liquid channel, and the oil outlet opening in sequence, and then flow out of the oil outlet opening into a vehicle's oil tank, thereby completing the refueling operation for the vehicle. Moreover, compared with an ordinary brushed motor, the brushless motor has a small loss during use and a longer service life. Furthermore, the partition part is configured for separating the motor housing into the first installation cavity and the second installation cavity, the permanent magnet rotor part is installed in the second installation cavity through the second opening, the stator winding part is provided in the first installation cavity, and the sealing part is configured for sealing and covering the first opening to seal the first installation cavity, so that the stator winding part can be effectively protected, and the stator winding part can be prevented from being eroded by the liquid. The brushless motor also includes a driver and a position detection device. The position detection device is used for detecting a position of the permanent magnet rotor part. The driver is used for sequentially energizing the stator winding part according to a specific order based on the position of the permanent magnet rotor part, so that a magnetic field of the stator winding part always maintains an angle difference with a magnetic field of the permanent magnet rotor part, thereby generating continuous torque to push the permanent magnet rotor part to rotate, so that the permanent magnet rotor part rotates to drive the oil in the oil tank to pass through the first oil pumping opening, the first liquid channel, and the oil outlet opening in sequence, and to flow out of the oil outlet opening into the vehicle's oil tank.

BRIEF DESCRIPTION OF THE DRAWINGS

Implementations of the present disclosure will now be described, by way of embodiment, with reference to the attached figures. It should be understood, the drawings are shown for illustrative purpose only, for ordinary person skilled in the art, other drawings obtained from these drawings without paying creative labor by an ordinary person skilled in the art should be within scope of the present disclosure.

DETAILED DESCRIPTION OF THE EMBODIMENTS

Figure 1:
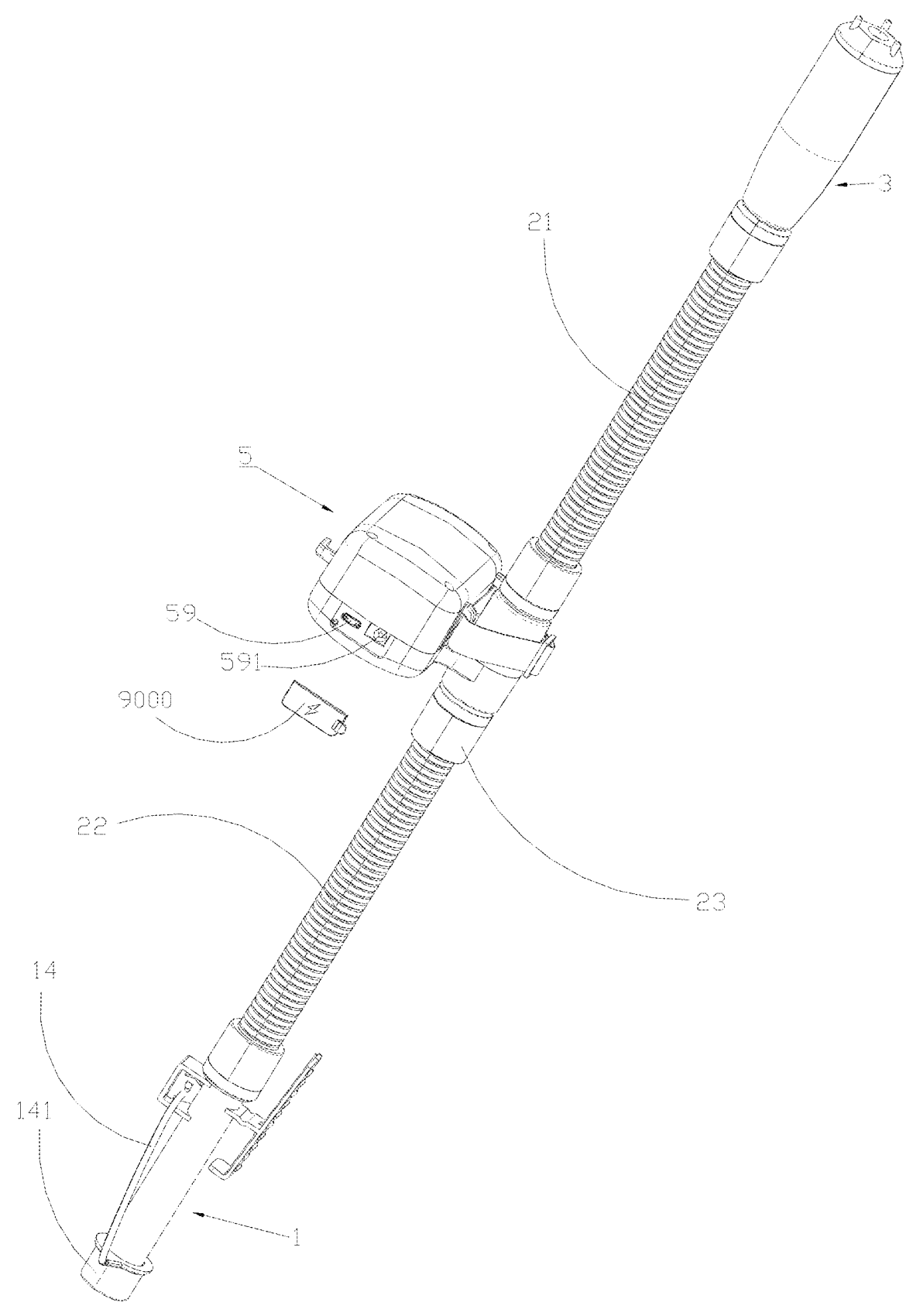
FIG. 1 is a schematic diagram of an overall structure of the present invention.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one". In addition, the terms "first" and "second" are used for descriptive purposes only and cannot be understood as indicating or implying relative importance or implying the number of indicated technical features. Thus, the features defined as "first" and "second" may explicitly or implicitly include one or more of the features. In the description of embodiments of the application, "a plurality of" means two or more, unless otherwise specifically defined.

Figure 2:
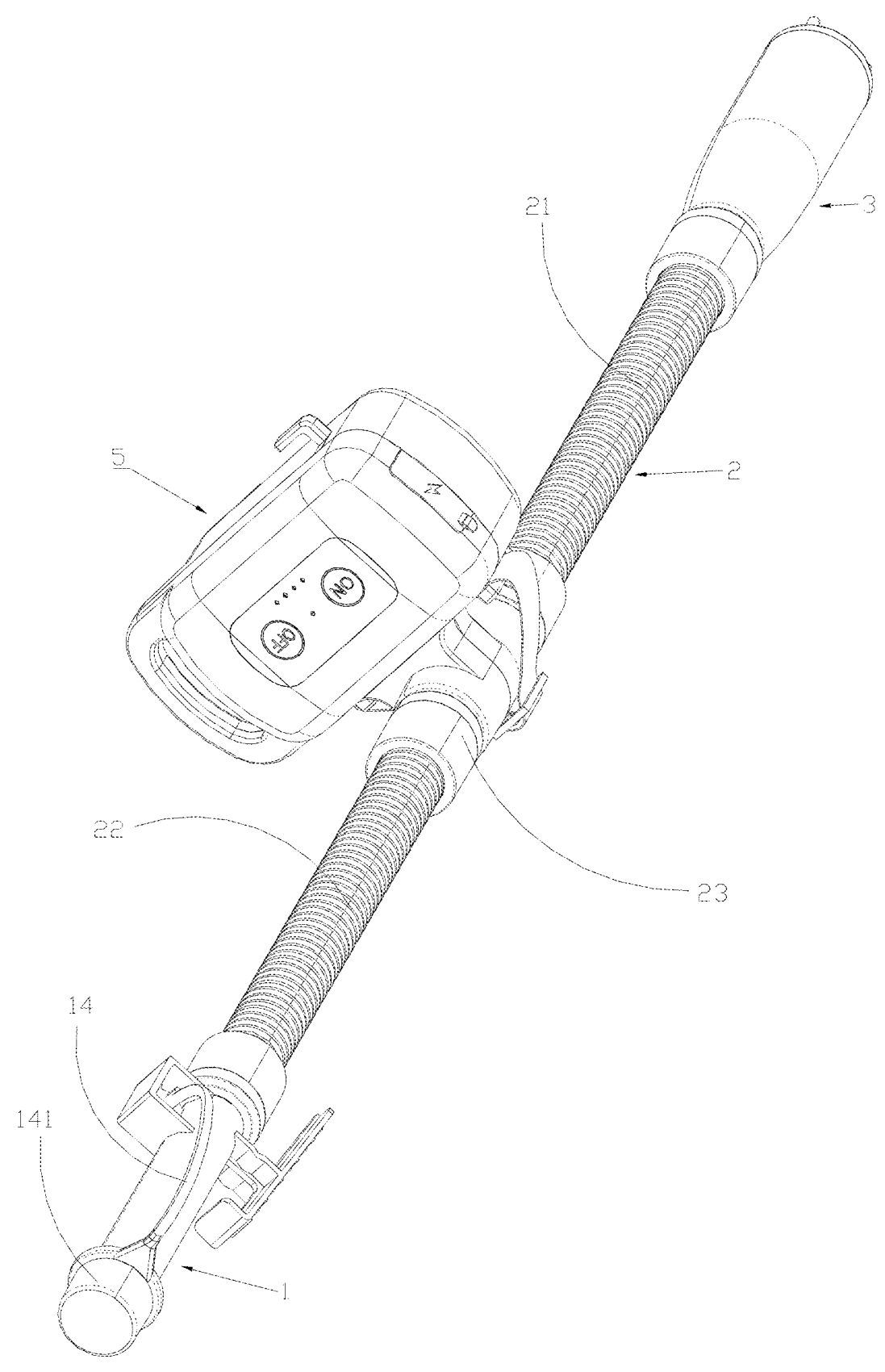
FIG. 2 is another schematic diagram of an overall structure of the present invention.
Figure 3:
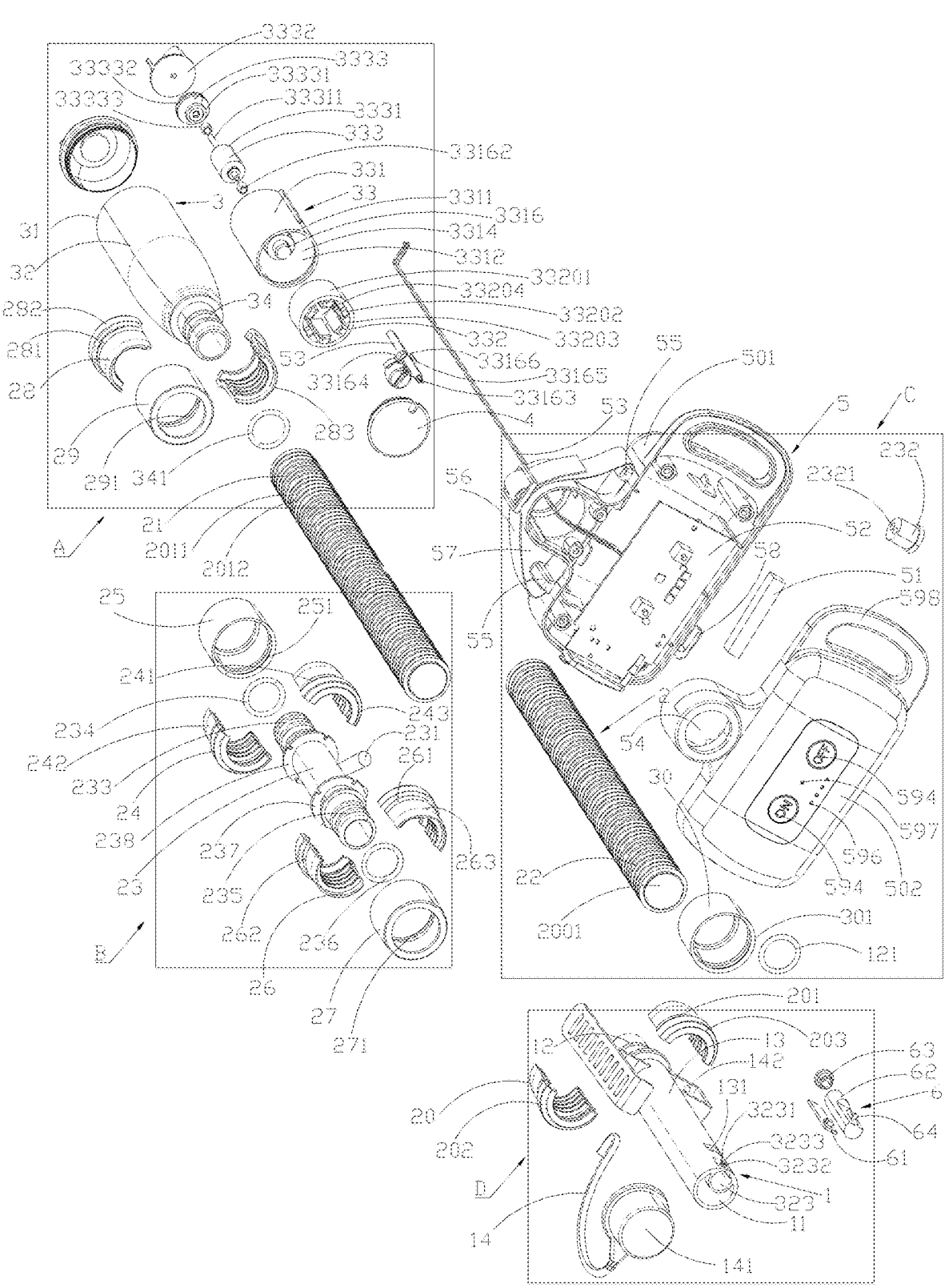
FIG. 3 is an exploded view of the present invention.
Figure 4:
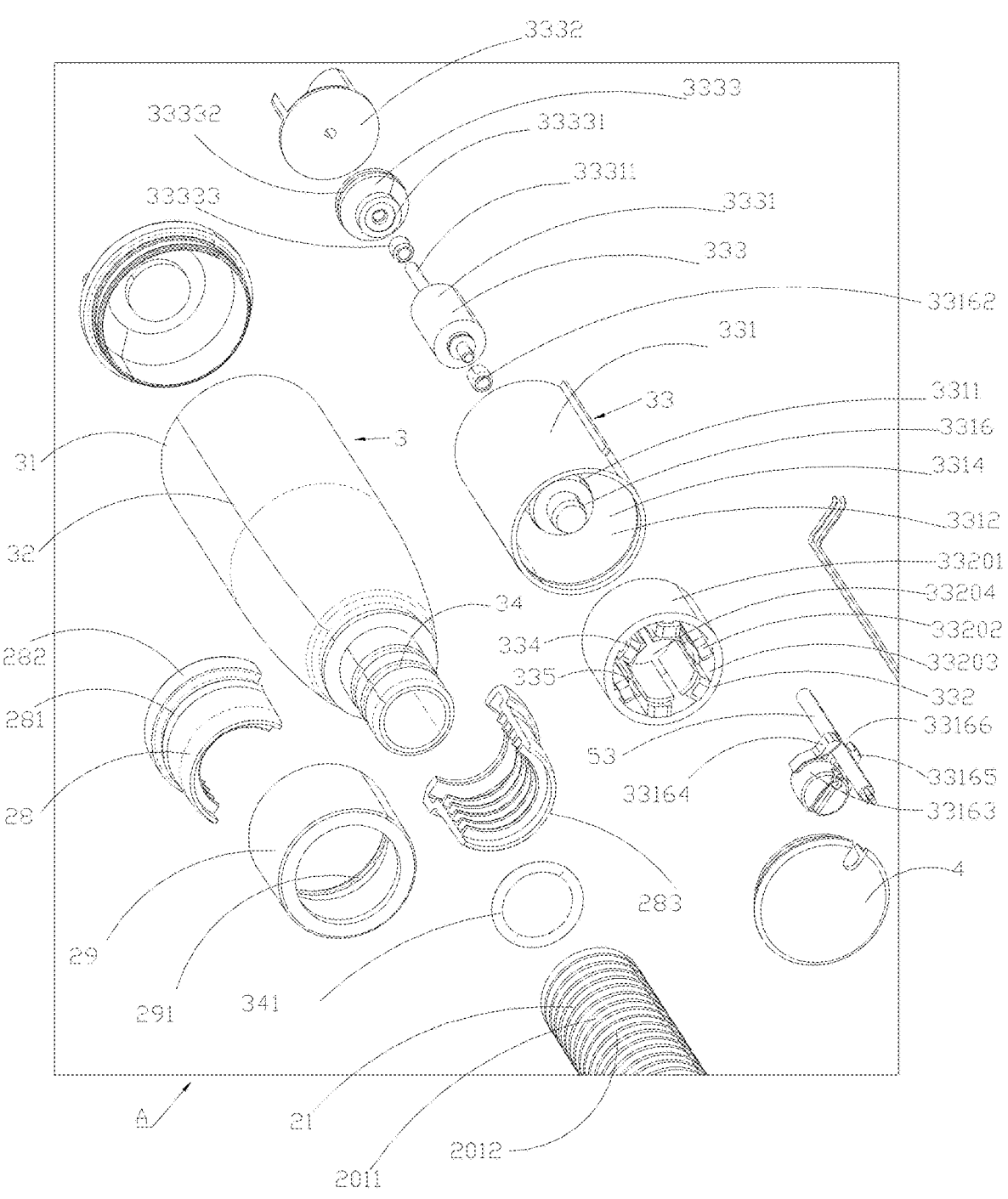
FIG. 4 is an enlarged view of area A in FIG. 3.
Figure 5:
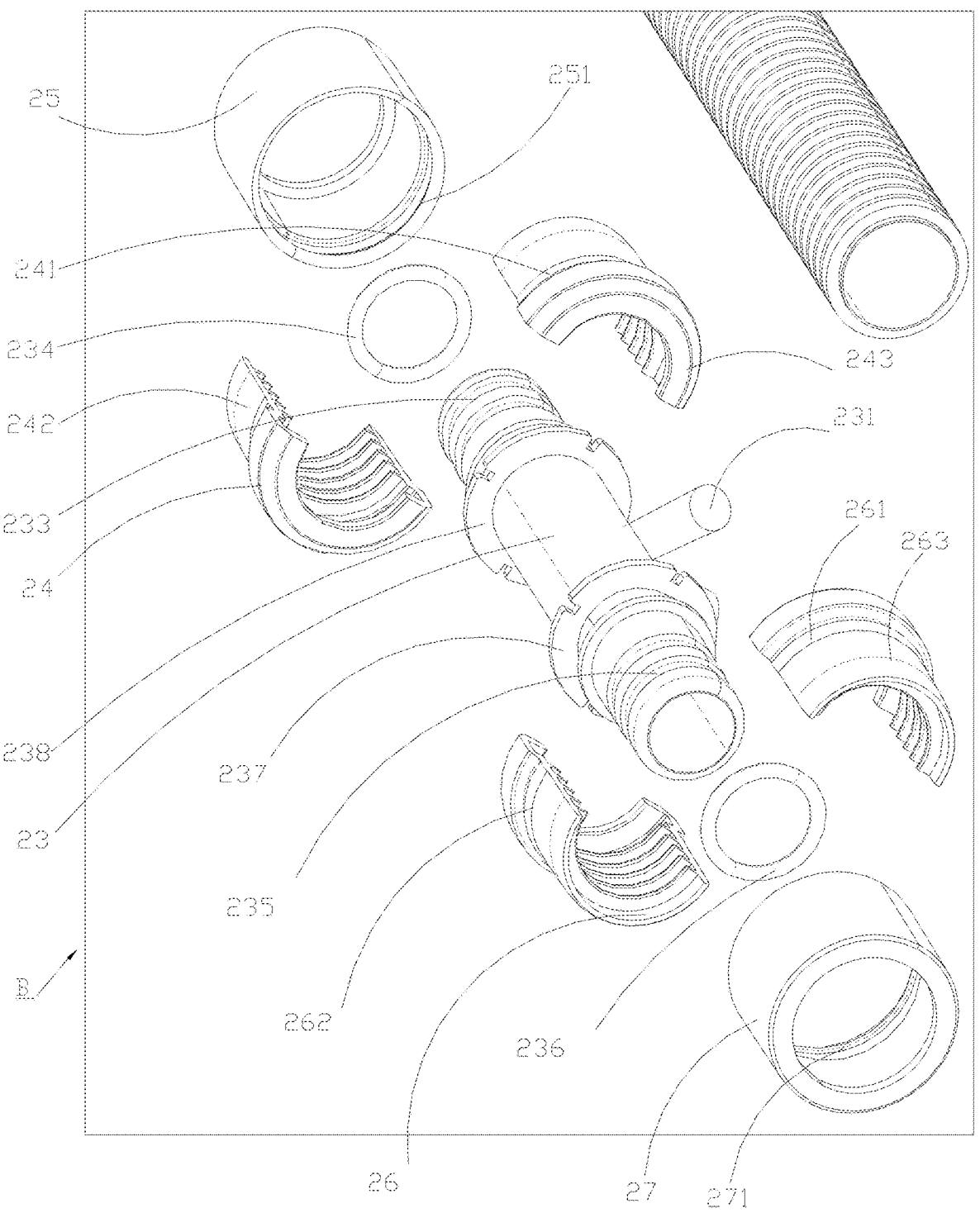
FIG. 5 is an enlarged view of area B in FIG. 3.
Figure 6:
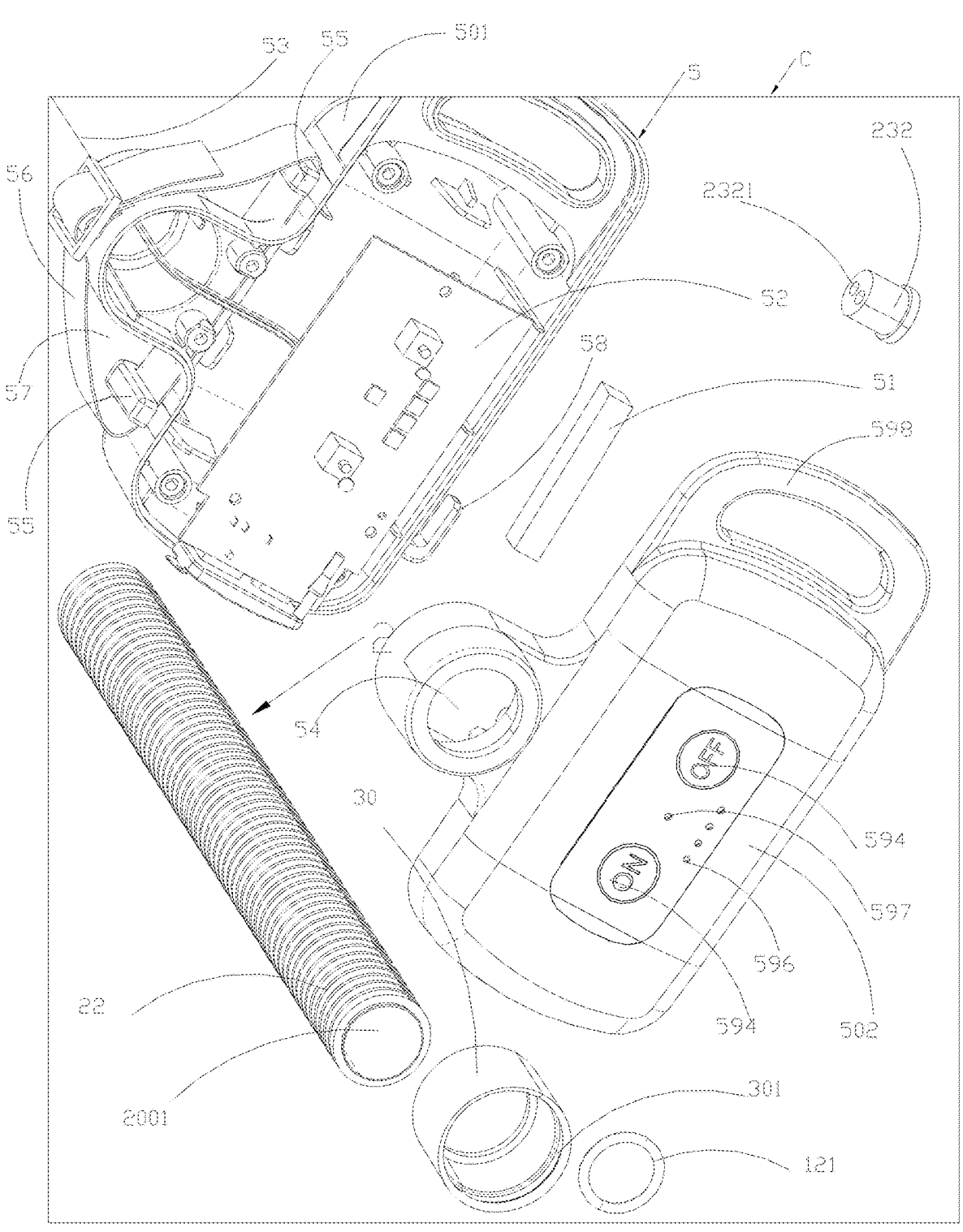
FIG. 6 is an enlarged view of area C in FIG. 3.
Figure 7:
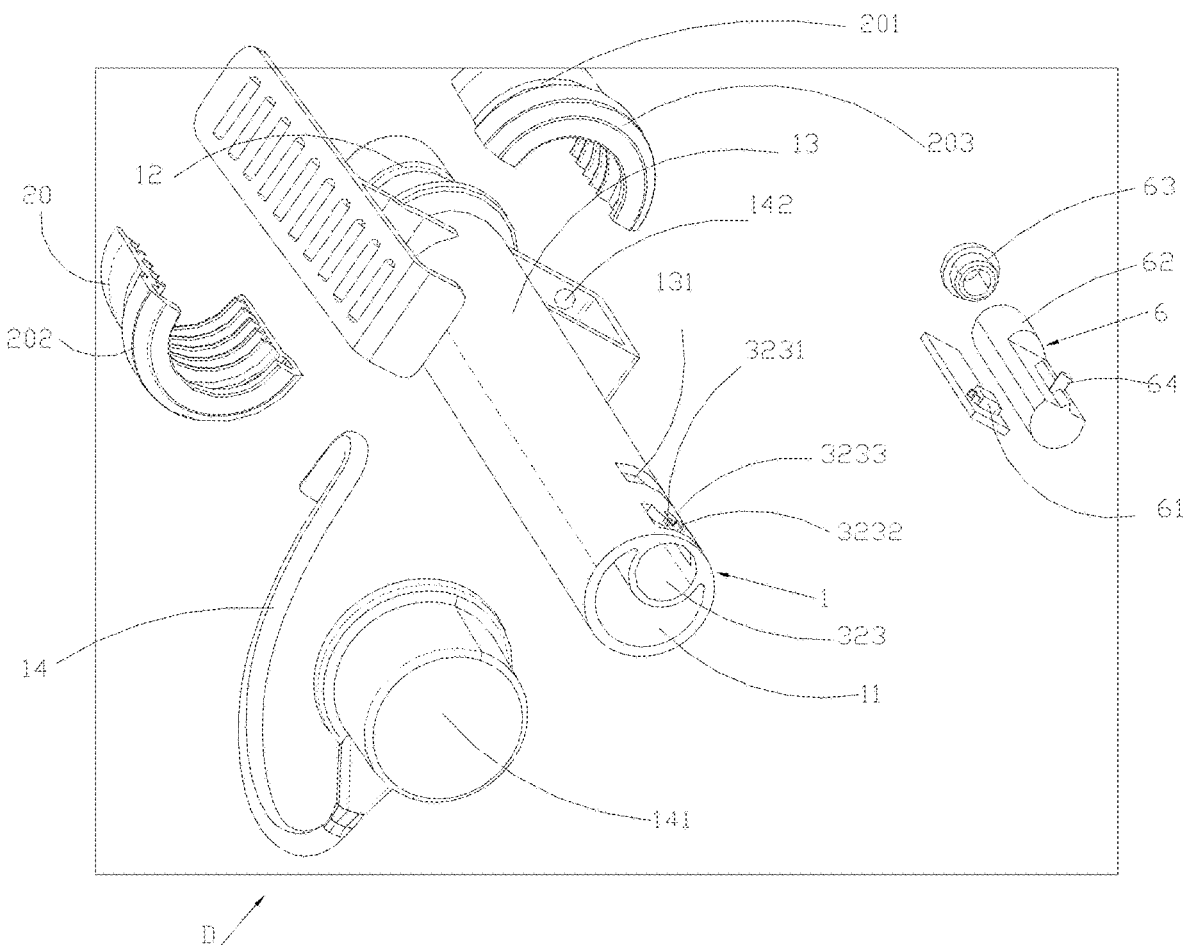
FIG. 7 is an enlarged view of area D in FIG. 3.
Figure 8:
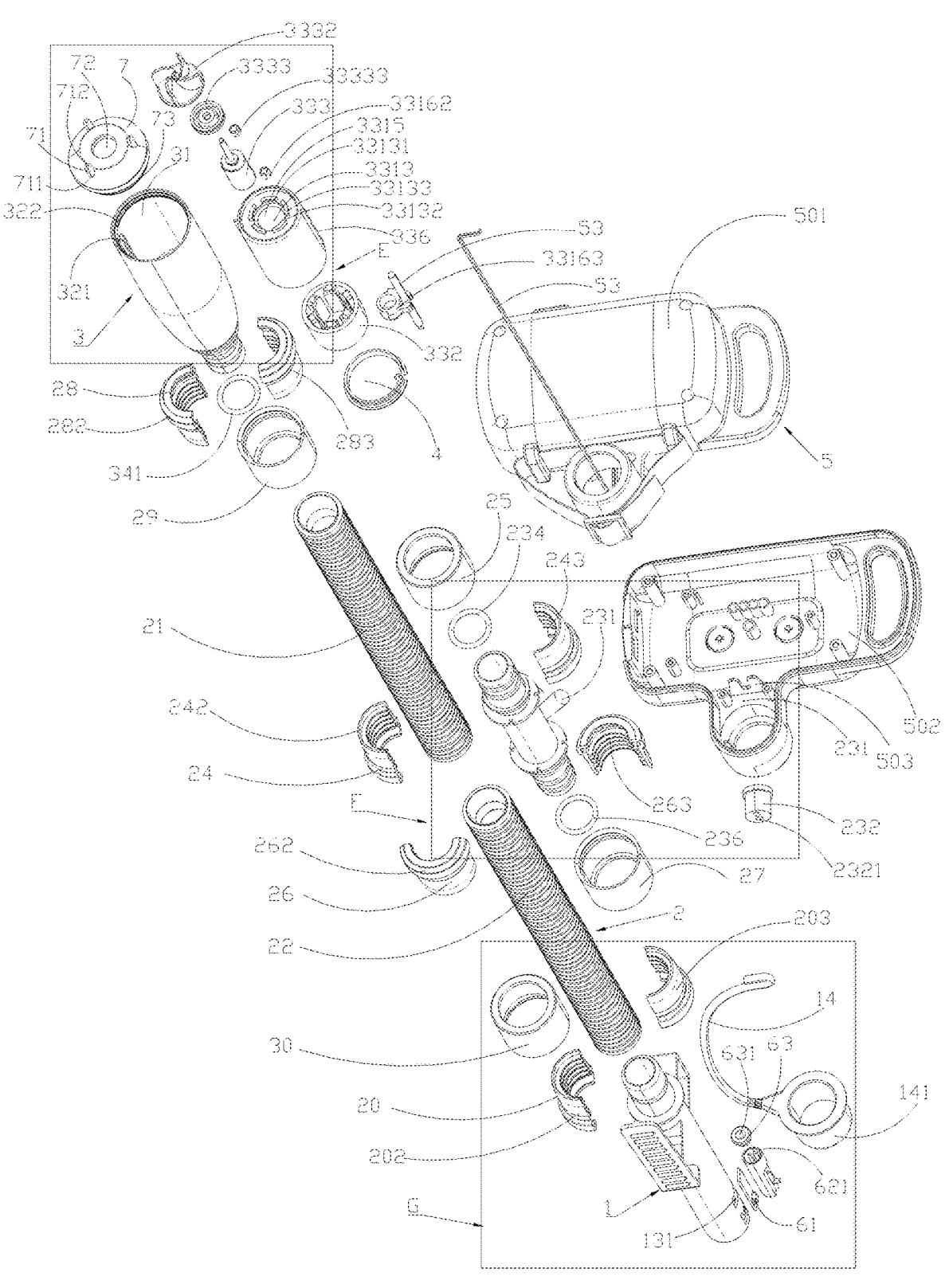
FIG. 8 is another exploded view of the present invention.
Figure 9:
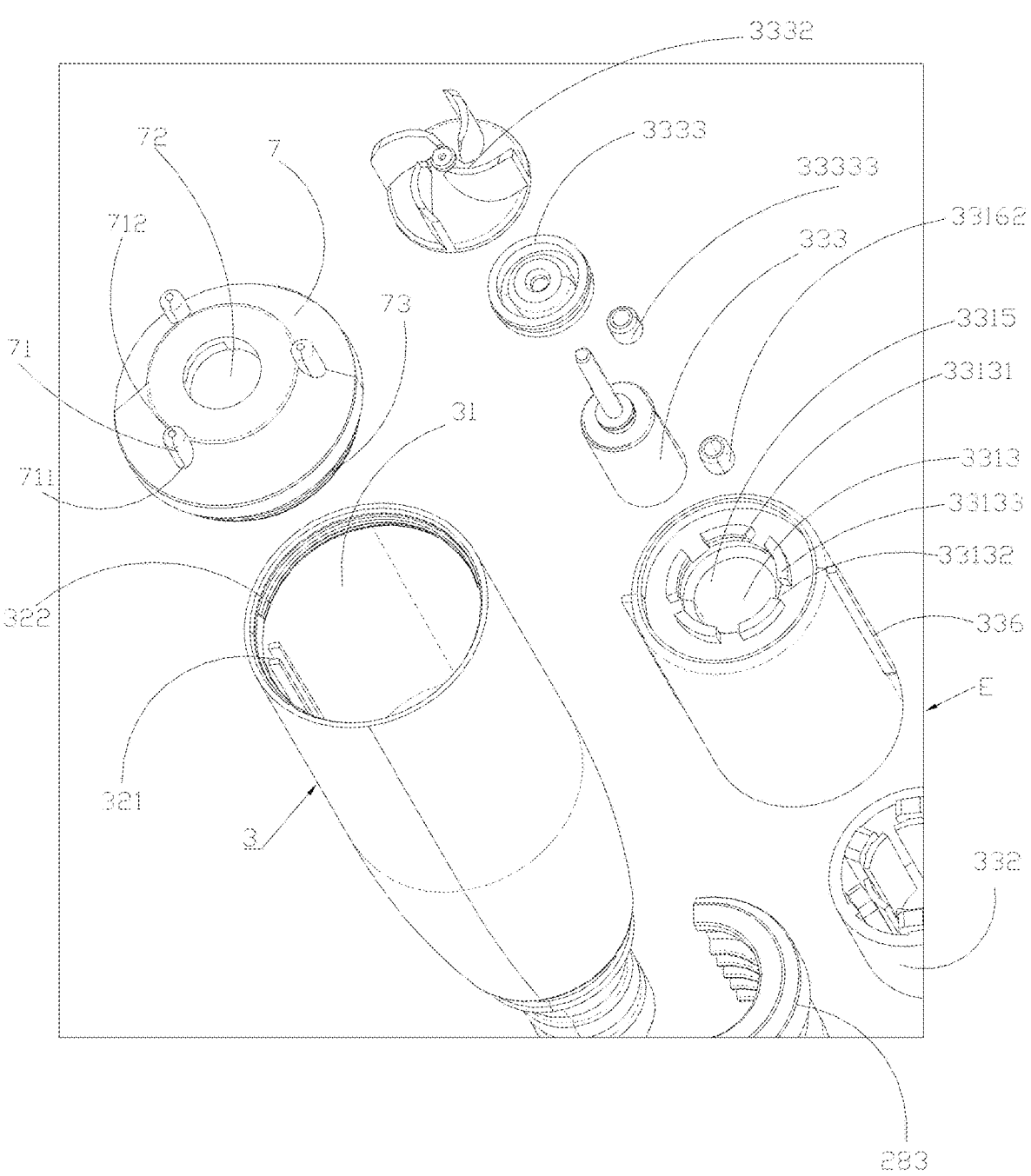
FIG. 9 is an enlarged view of area E in FIG. 8.
Figure 10:
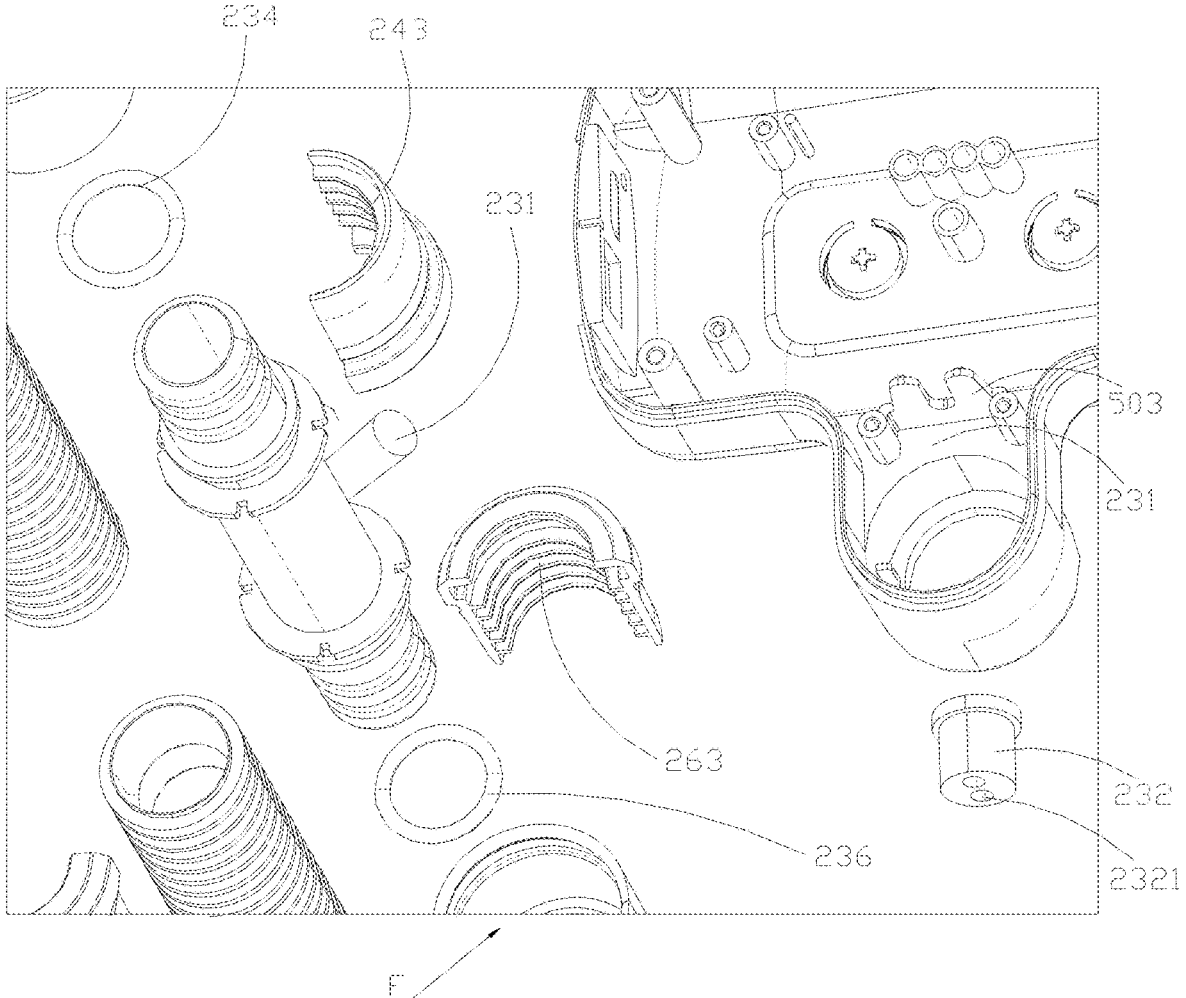
FIG. 10 is an enlarged view of area F in FIG. 8.
Figure 11:
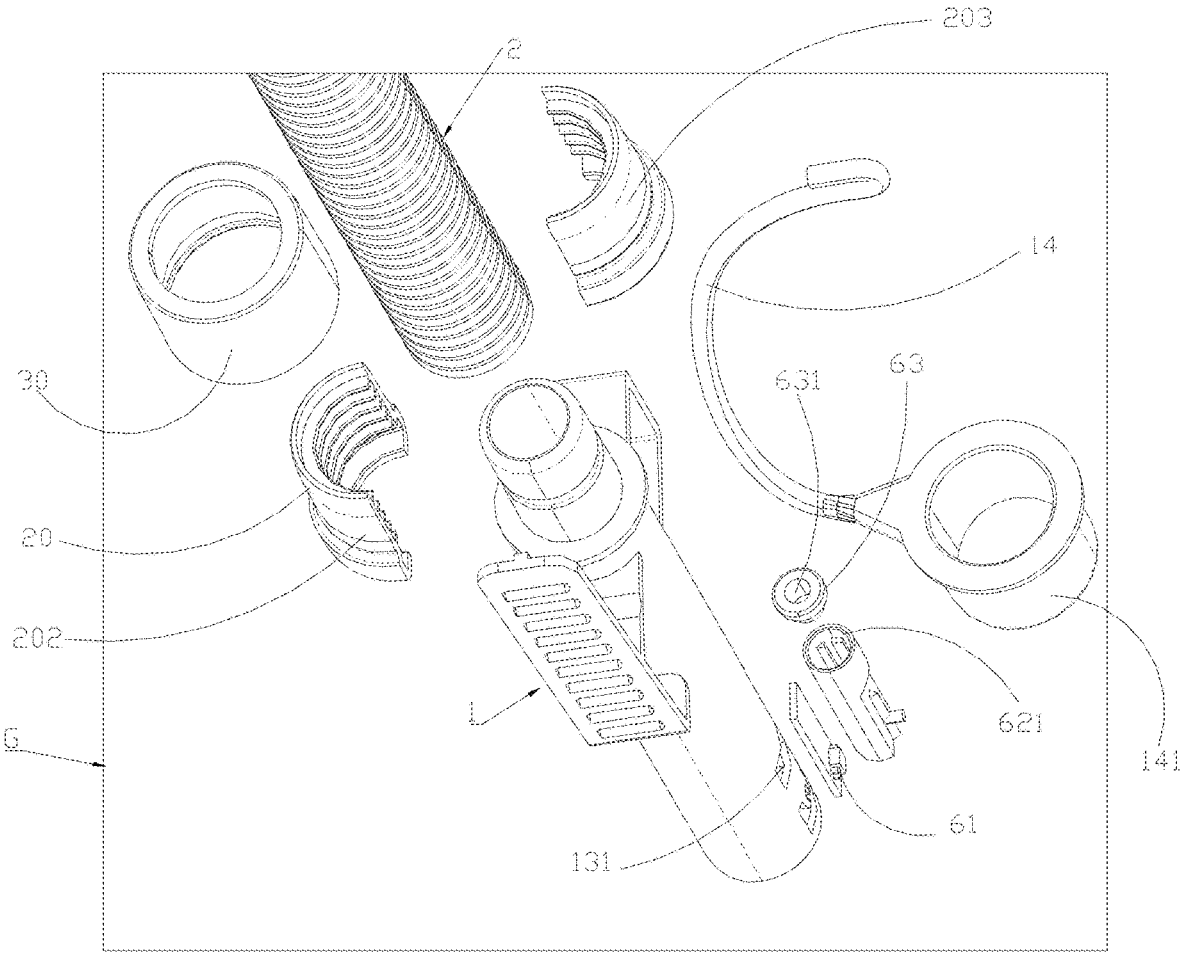
FIG. 11 is an enlarged view of area G in FIG. 8.
Figure 12:
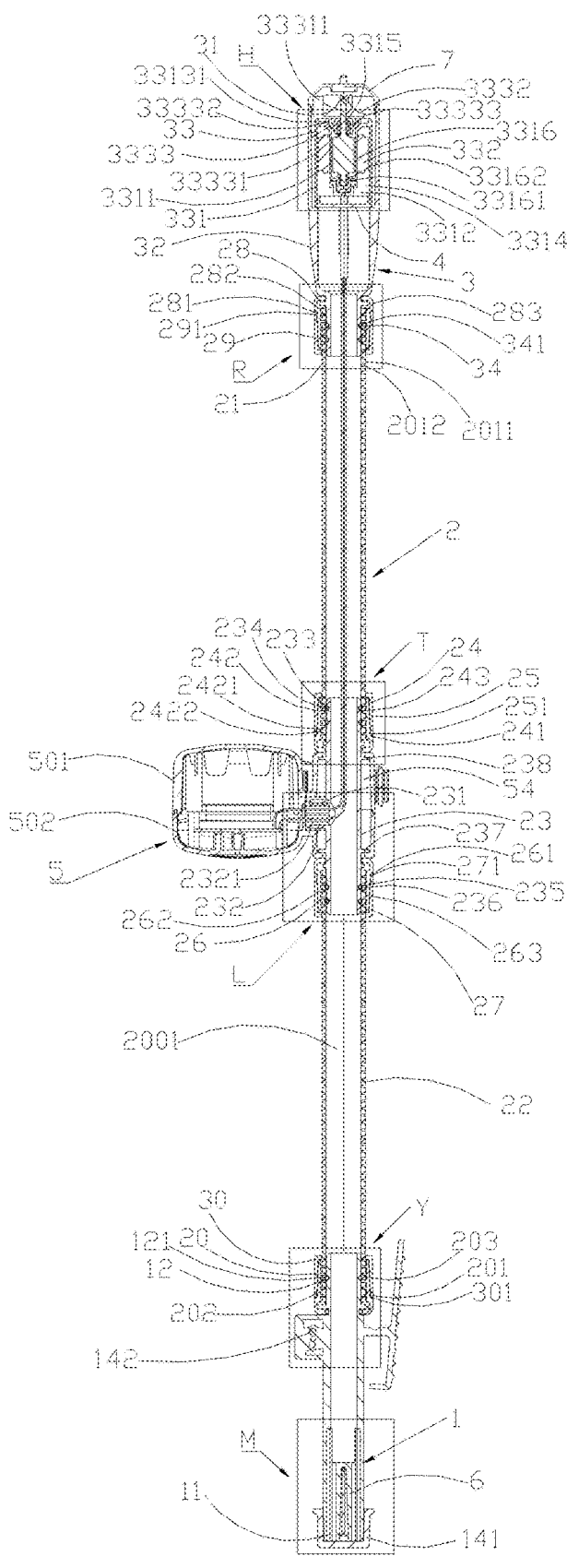
FIG. 12 is a sectional view taken along an oil conveying pipeline, an oil pumping part, and an oil outlet part.
Figure 13:
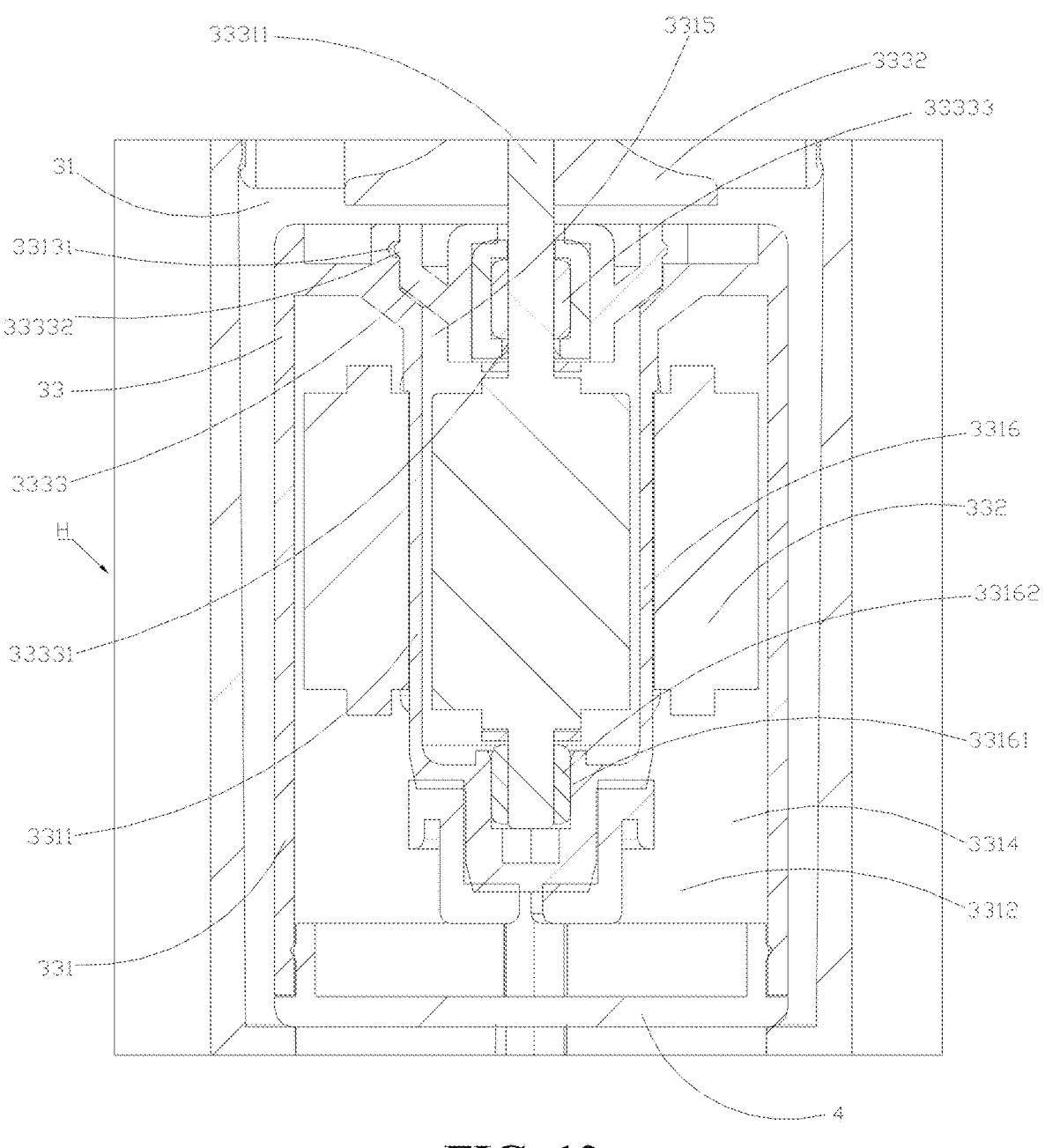
FIG. 13 is an enlarged view of area H in FIG. 12.
Figure 14:
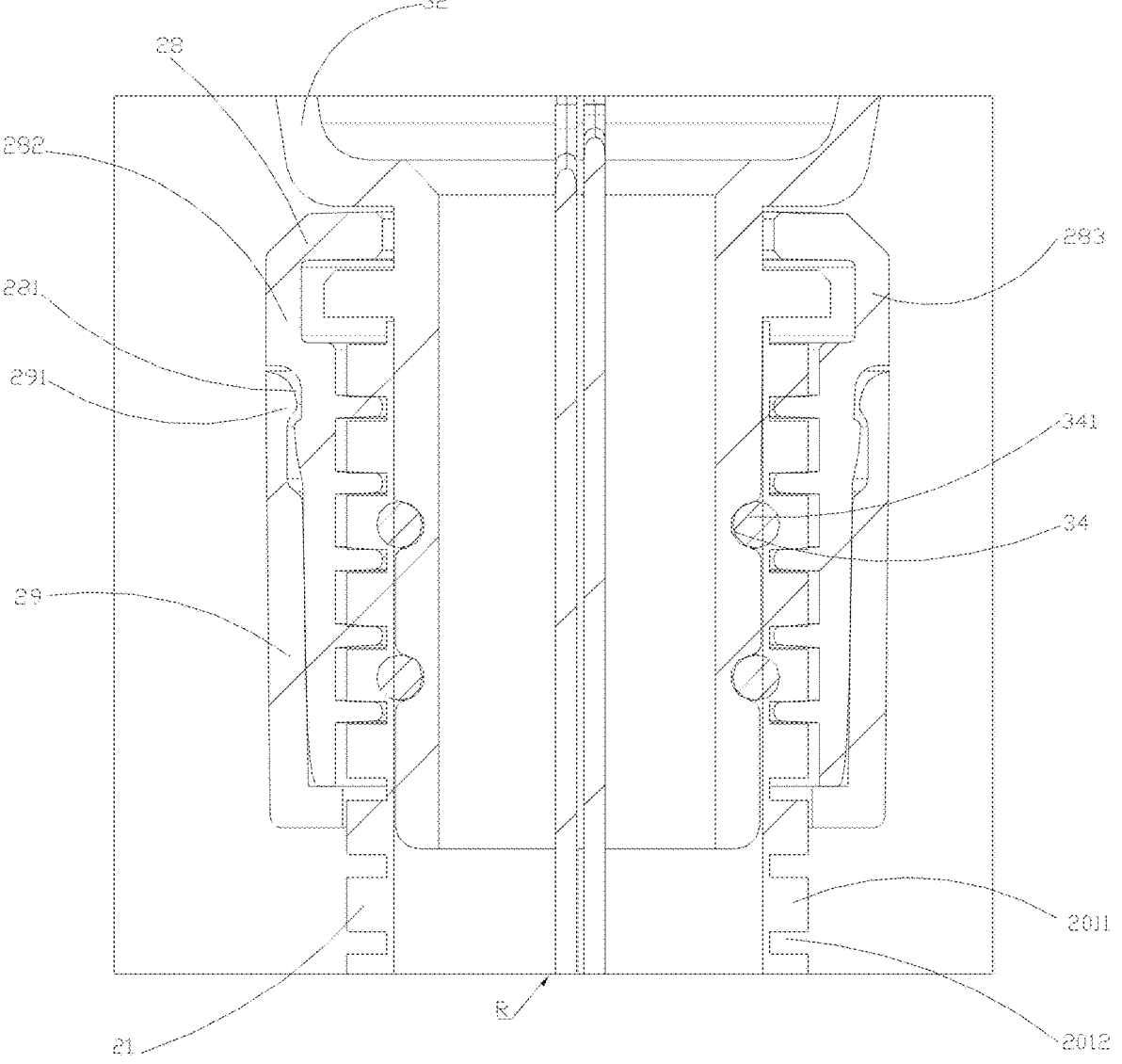
FIG. 14 is an enlarged view of area R in FIG. 12.
Figure 15:
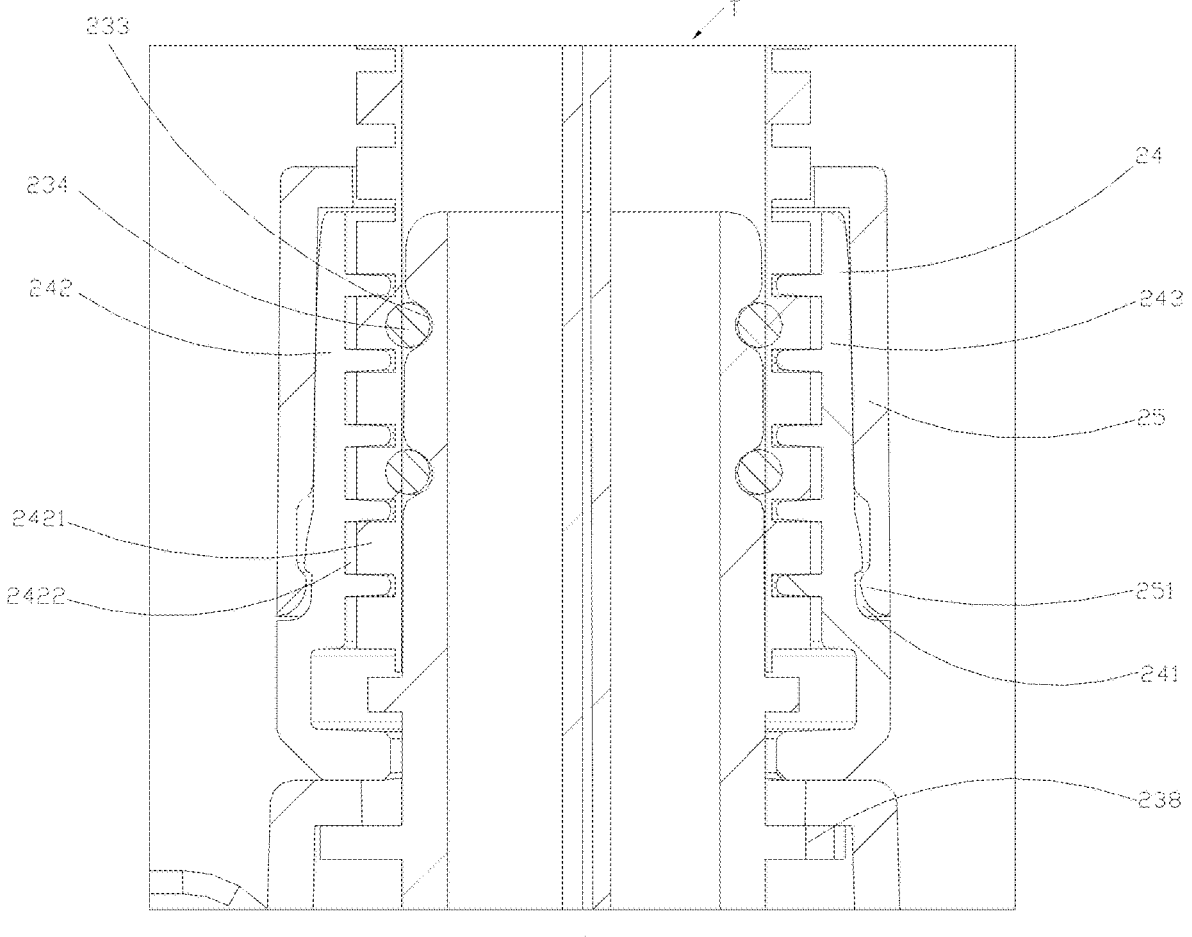
FIG. 15 is an enlarged view of area T in FIG. 12.
Figure 16:
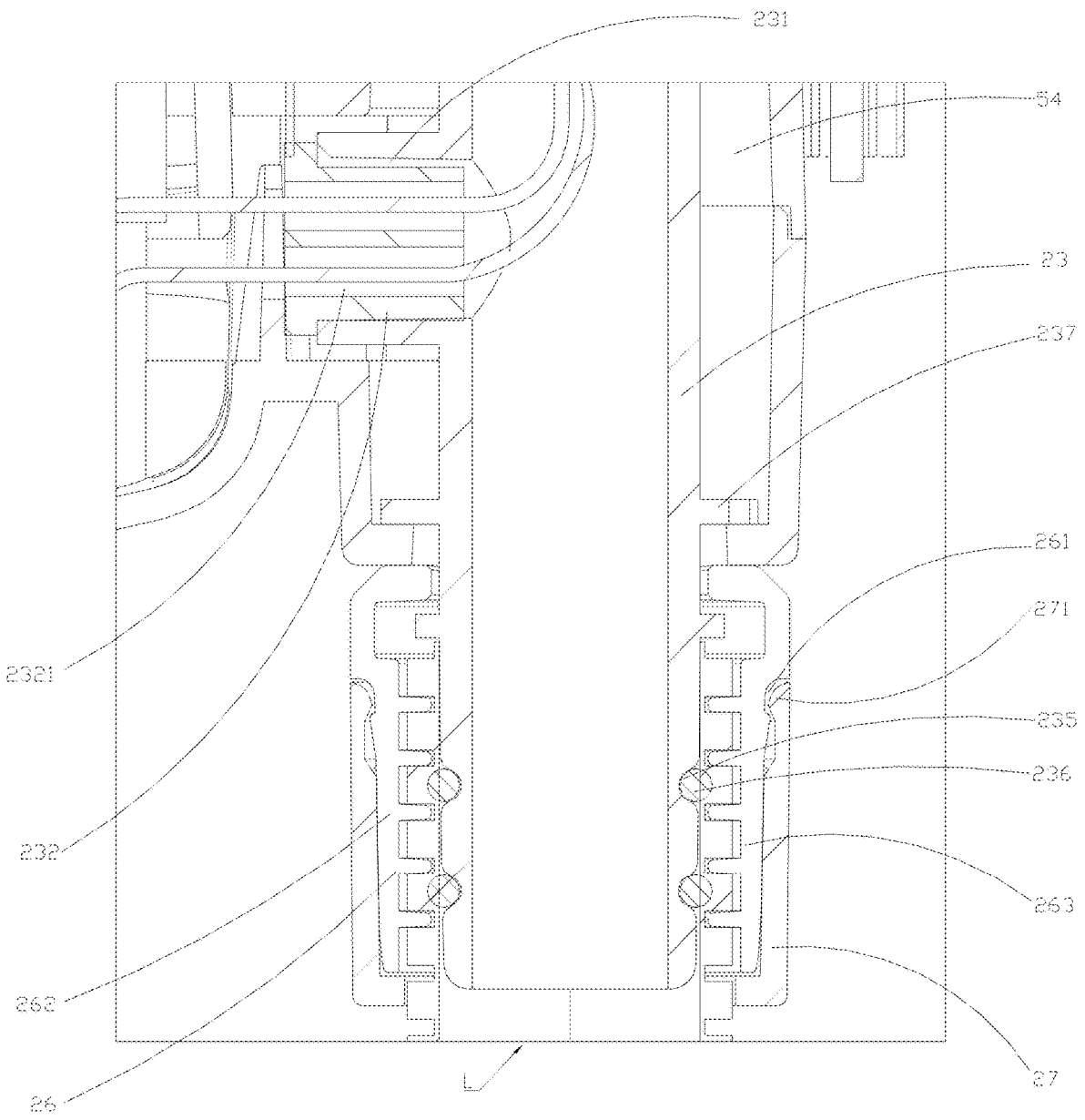
FIG. 16 is an enlarged view of area L in FIG. 12.
Figure 17:
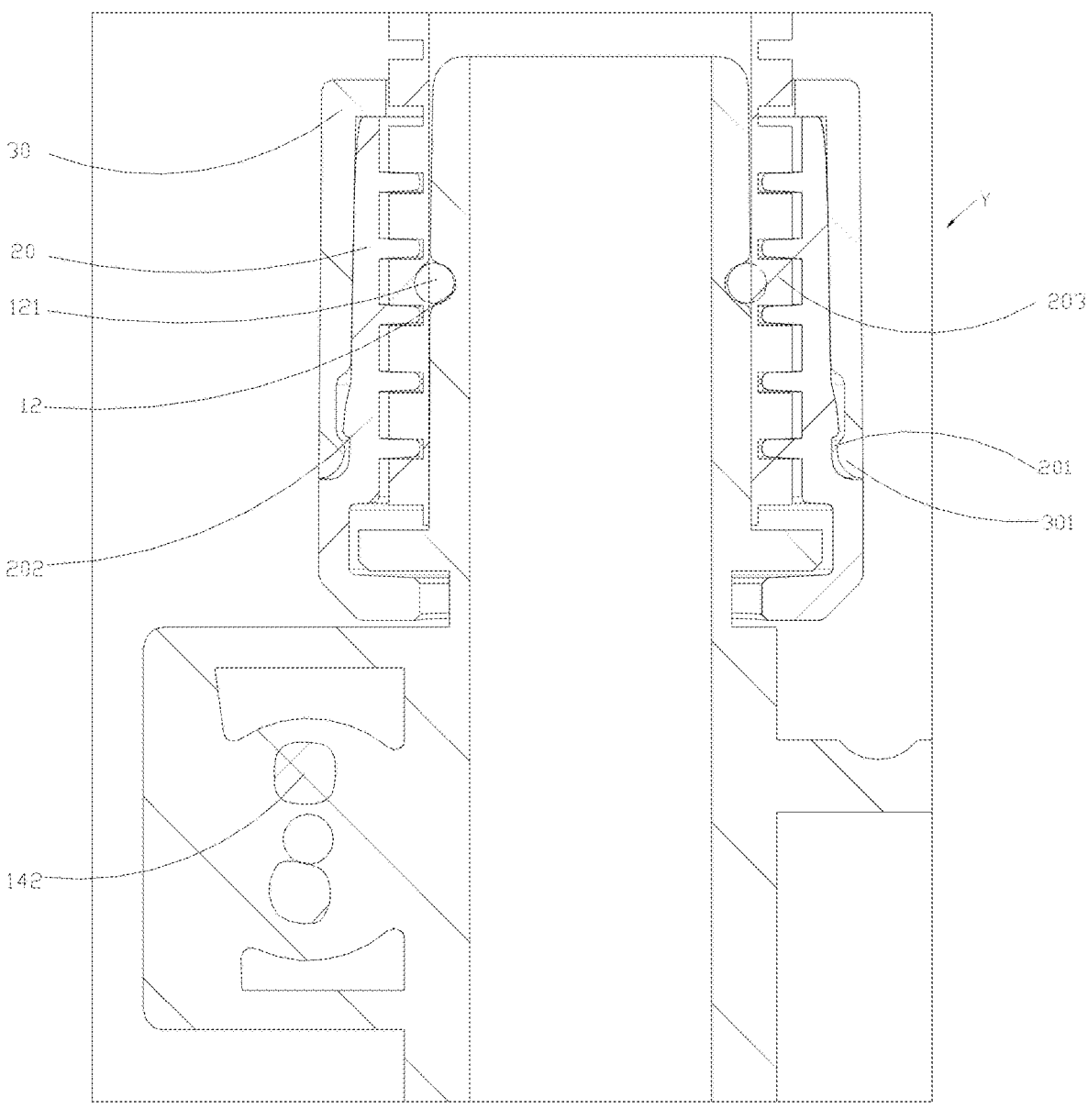
FIG. 17 is an enlarged view of area Y in FIG. 12.
Figure 18:
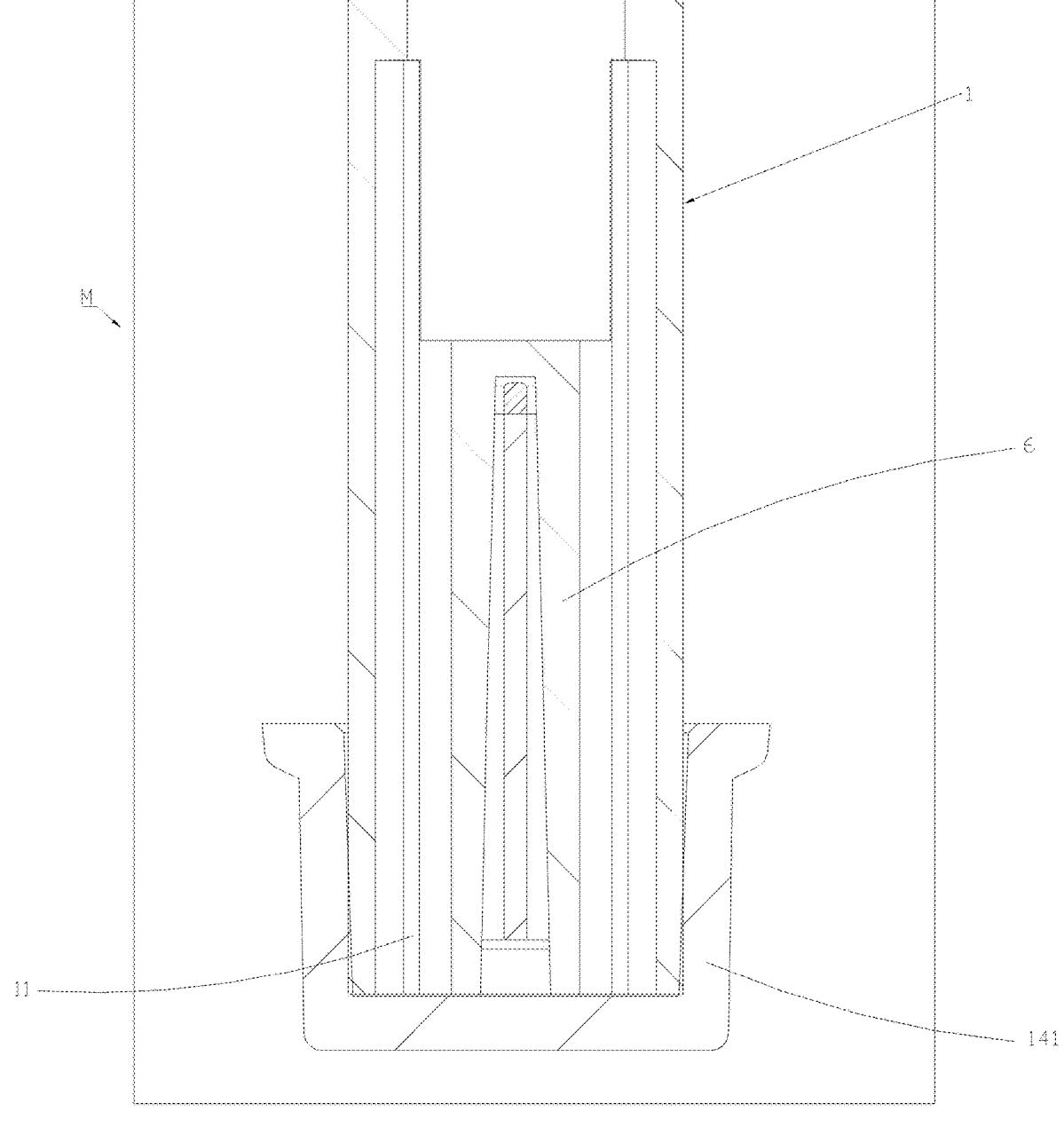
FIG. 18 is an enlarged view of area M in FIG. 12.
Figure 19:
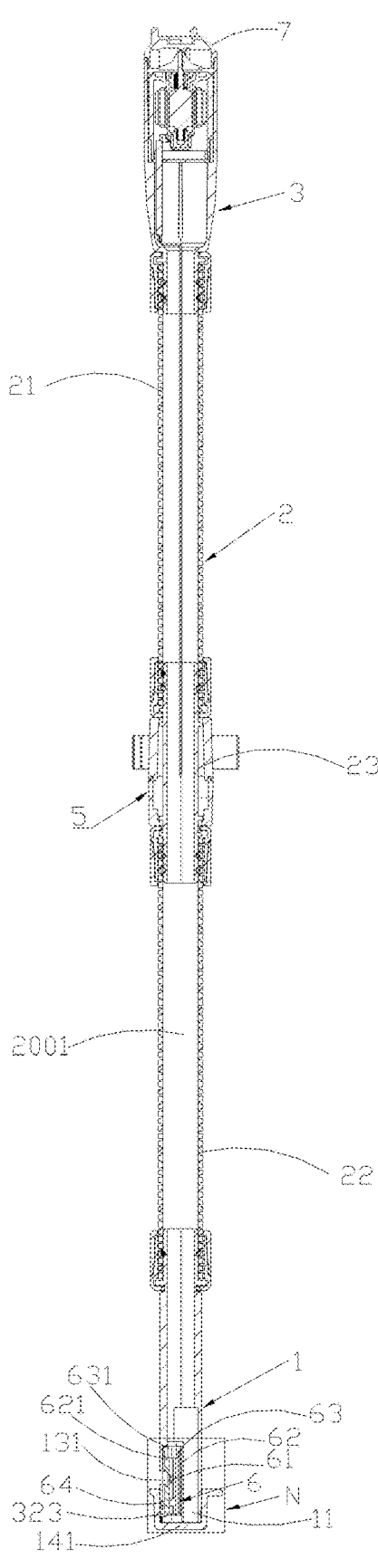
FIG. 19 is another sectional view taken along an oil conveying pipeline, an oil pumping part, and an oil outlet part.
Figure 20:
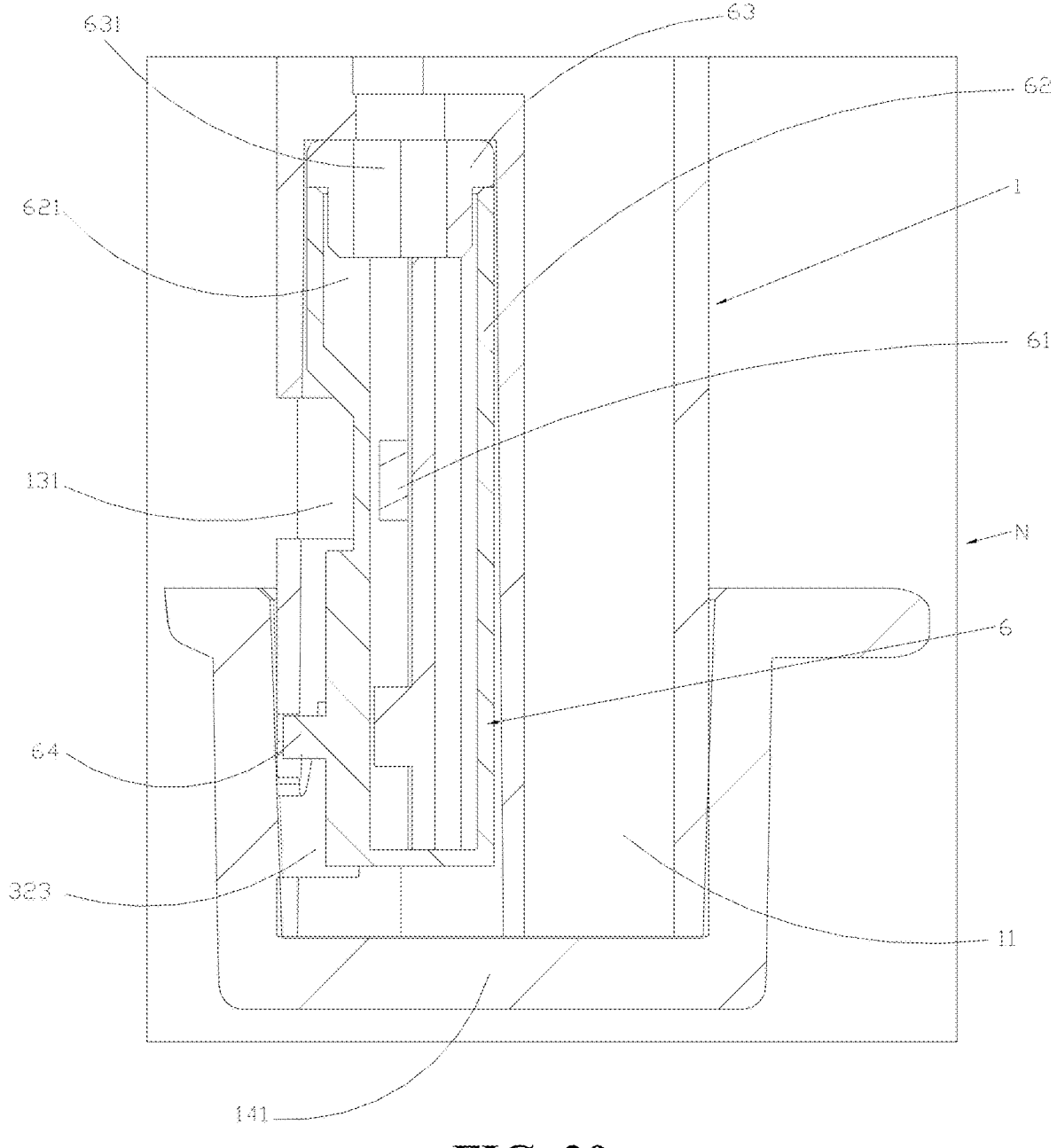
FIG. 20 is an enlarged view of area N in FIG. 19.
Figure 21:
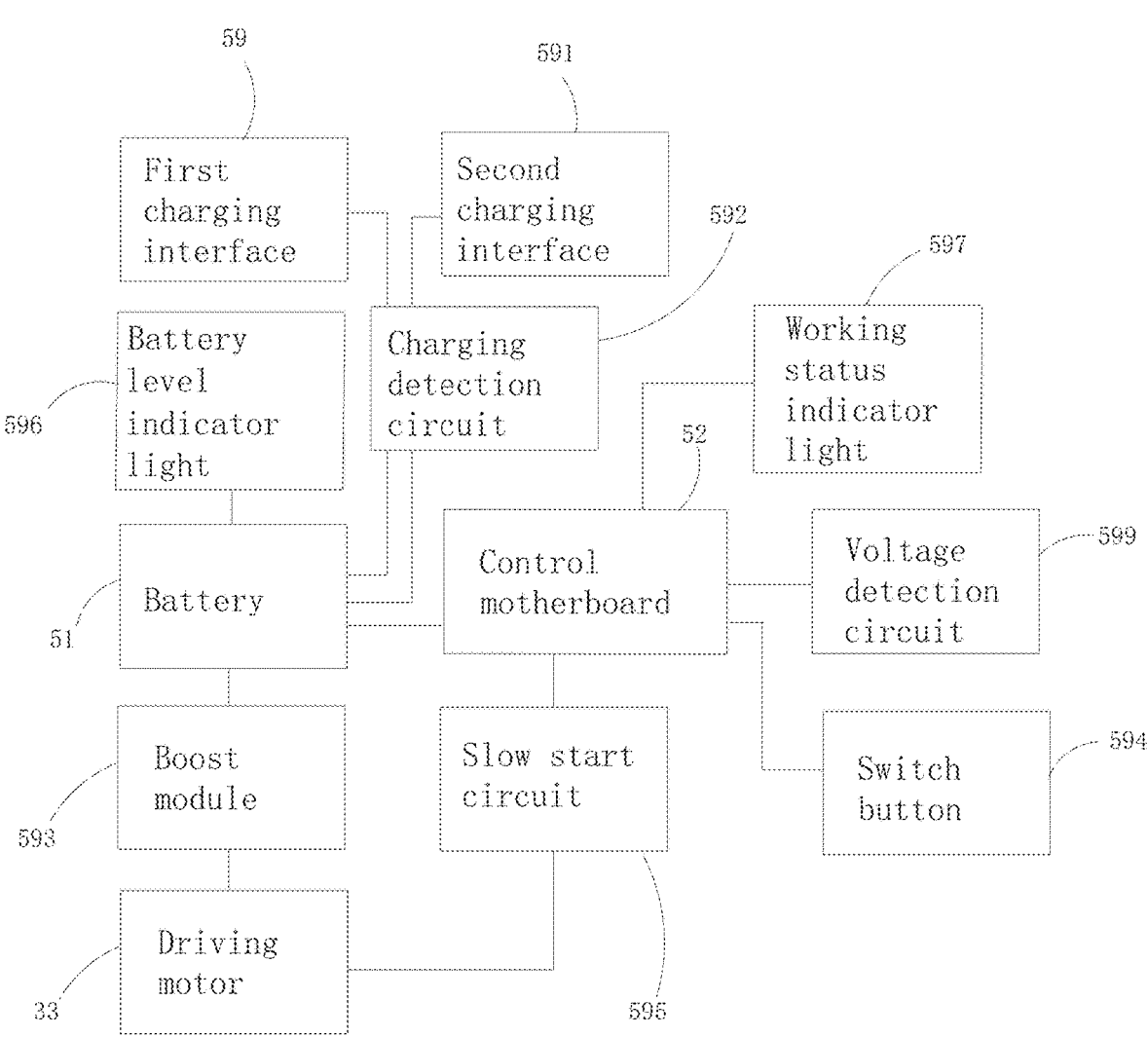
FIG. 21 is a schematic diagram of a charging detection circuit and a slow start circuit.

Referring to FIGS. 1-20, an oil pump includes:

an oil outlet part 1, wherein an oil outlet opening 11 is defined in the oil outlet part 1;

a hollow oil conveying pipeline 2, wherein the oil conveying pipeline 2 is provided with a first liquid channel 2001;

an oil pumping part 3, wherein a first oil pumping opening 31 is defined in the oil pumping part 3; the oil pumping part 3 is connected to the oil outlet part 1 through the oil conveying pipeline 2, and the oil pumping part 3, the oil conveying pipeline 2, and the oil outlet part 1 are in communication with each other; the oil pumping part 3 is provided with an oil pumping housing 32 and a driving motor 33, the driving motor 33 is positioned inside the oil pumping housing 32, the driving motor 33 is connected to the oil pumping housing 32, and the driving motor 33 is used for driving oil to pass through the first oil pumping opening 31, the first liquid channel 2001, and the oil outlet opening 11 in sequence and flow out through the oil outlet opening 11; the driving motor 33 is a brushless motor, the brushless motor includes a motor housing 331, a stator winding part 332, and a permanent magnet rotor part 333, the motor housing 331 is provided with a partition part 3311, and the partition part 3311 is configured for dividing the motor housing 331 into a first installation cavity 3312 and a second installation cavity 3313; a first opening 3314 is defined in the first installation cavity 3312, a second opening 3315 is defined in the second installation cavity 3313, the stator winding part 332 is installed in the first installation cavity 3312 through the first opening 3314, and the permanent magnet rotor part 333 is installed in the second installation cavity 3313 through the second opening 3315; and a sealing part 4, wherein the sealing part 4 is configured for sealing and covering the first opening 3314 to seal the first installation cavity 3312.

Through the above structure, the oil pump includes the oil outlet part 1, the hollow oil conveying pipeline 2, the oil pumping part 3, and the sealing part 4. The oil outlet opening 11 is defined in the oil outlet part 1. The oil conveying pipeline 2 is provided with the first liquid channel 2001. The first oil pumping opening 31 is defined in the oil pumping part 3. The oil pumping part 3 is connected to the oil outlet part 1 through the oil conveying pipeline 2. The oil pumping part 3, the oil conveying pipeline 2, and the oil outlet part 1 are in communication with each other. The oil pumping part 3 is provided with the oil pumping housing 32 and the driving motor 33. The driving motor 33 is positioned inside the oil pumping housing 32. The driving motor 33 is connected to the oil pumping housing 32. The driving motor 33 is used for driving the oil to pass through the first oil pumping opening 31, the first liquid channel 2001, and the oil outlet opening 11 in sequence and flow out through the oil outlet opening 11. The driving motor 33 is the brushless motor. The brushless motor includes the motor housing 331, the stator winding part 332, and the permanent magnet rotor part 333. The motor housing 331 is provided with the partition part 3311. The partition part 3311 is configured for dividing the motor housing 331 into the first installation cavity 3312 and the second installation cavity 3313. The first opening 3314 is defined in the first installation cavity 3312. The second opening 3315 is defined in the second installation cavity 3313. The stator winding part 332 is installed in the first installation cavity 3312 through the first opening 3314. The permanent magnet rotor part 333 is installed in the second installation cavity 3313 through the second opening 3315. The sealing part 4 is configured for sealing and covering the first opening 3314 to seal the first installation cavity 3312. Therefore, the brushless motor is capable of driving the oil in an oil tank to flow through the first oil pumping opening 31, the first liquid channel 2001, and the oil outlet opening 11 in sequence, and then flow out of the oil outlet opening 11 into a vehicle's oil tank, thereby completing the refueling operation for the vehicle. Moreover, compared with an ordinary brushed motor, the brushless motor has a small loss during use and a longer service life. Furthermore, the partition part 3311 is configured for separating the motor housing 331 into the first installation cavity 3312 and the second installation cavity 3313, the permanent magnet rotor part 333 is installed in the second installation cavity 3313 through the second opening 3315, the stator winding part 332 is provided in the first installation cavity 3312, and the sealing part 4 is configured for sealing and covering the first opening 3314 to seal the first installation cavity 3312, so that the stator winding part 332 can be effectively protected, and the stator winding part 332 can be prevented from being eroded by liquid. The brushless motor also includes a driver 334 and a position detection device 335. The position detection device 335 is used for detecting a position of the permanent magnet rotor part 333. The driver 334 is used for sequentially energizing the stator winding part according to a specific order based on the position of the permanent magnet rotor part 333, so that a magnetic field of the stator winding part 332 always maintains an angle difference with a magnetic field of the permanent magnet rotor part 333, thereby generating continuous torque to push the permanent magnet rotor part 333 to rotate, so that the permanent magnet rotor part 333 rotates to drive the oil in the oil tank to pass through the first oil pumping opening 31, the first liquid channel 2001, and the oil outlet opening 11 in sequence, and to flow out of the oil outlet opening 11 into the vehicle's oil tank.

In this embodiment, the sealing part 4 is an epoxy resin sealing part 4. The epoxy resin sealing part 4 is formed by pouring epoxy resin into the first opening 3314 and then curing the epoxy resin. After an electrical connection wire 53 is connected to the stator winding part 332 through the first opening 3314, an epoxy resin solution is poured into the first opening 3314, and the epoxy resin solution is cured to form the epoxy resin sealing part 4 that seals the first opening 3314.

In this embodiment, the permanent magnet rotor part 333 includes a permanent magnet rotor 3331 and an impeller 3332. The permanent magnet rotor 3331 is arranged in the second installation cavity 3313 through the second opening 3315. The impeller 3332 is connected to the permanent magnet rotor 3331. The first installation cavity 3312 is internally equipped with a protruding installation column 3316. The stator winding part 332 is sleeved on the installation column 3316. The oil pump further includes a rotor installation housing 3333. The rotor installation housing 3333 is connected to an inner side wall of the second installation cavity, and the rotor installation housing 3333 is configured for preventing an axial movement of the permanent magnet rotor in the second installation cavity. A third opening 33331 is defined in the rotor installation housing 3333. The permanent magnet rotor 3331 also includes a connecting shaft 33311. The connecting shaft 33311 penetrates out of the second installation cavity through the third opening 33331 and is connected to the impeller. An outer side wall of the rotor installation housing 3333 is provided with a first position limiting ring 33332. The inner side wall of the second installation cavity is provided with a first position limiting ring slot 33131. The first position limiting ring 33332 is positioned inside the first position limiting ring slot 33131. A side wall of the second installation cavity 3313 is provided with slits 33132 and elastic side walls 33133 formed between the slits 33132. The first position limiting ring slot 33131 is defined in the elastic side wall 33133. The installation column is a hollow installation column. The stator winding part 332 is sleeved on an outer surface of the installation column 3316. An inner surface of the installation column is provided with a concave first installation slot 33161. One end of the connecting shaft 33311 is inserted into the first installation slot 33161, and an opposite end of the connecting shaft 33311 penetrates out of the second installation cavity through the third opening 33331 and is connected to the impeller. A first bearing sleeve 33333 is provided between the connecting shaft 33311 and the third opening 33331. A second bearing sleeve 33162 is provided between the connecting shaft 33311 and the first installation slot 33161. The oil pump further includes an installation sleeve 33163. The installation sleeve 33163 is sleeved on the outer surface of the installation column. The installation sleeve 33163 is provided with a first wire clamping wall 33164 and a second wire clamping wall 33165. A wire clamping slot 33166 is formed between the first wire clamping wall 33164 and the second wire clamping wall 33165. The first wire clamping wall 33164 and the second wire clamping wall 33165 are used for clamping an electrical connection wire 53 in the wire clamping slot 33166. Through the above structure, the position detection device 335 is used for detecting the position of the permanent magnet rotor 3331, and the driver 334 is used for sequentially energizing the stator winding part in a specific order according to the position of the permanent magnet rotor 3331, so that the magnetic field of the stator winding part 332 always maintains an angle difference with the magnetic field of the permanent magnet rotor 3331, thereby generating continuous torque to push the permanent magnet rotor 3331 to rotate, so that the permanent magnet rotor 3331 drives the connecting shaft 33311 and the impeller 3332 to rotate. The impeller 3332 rotates to drive the oil in the oil tank to pass through the first oil pumping opening 31, the first liquid channel 2001, and the oil outlet opening 11 in sequence, and to flow out through the oil outlet opening 11 into the vehicle's oil tank, thereby completing the refueling operation for the vehicle. Moreover, when the first position limiting ring 33332 needs to be installed in the first position limiting ring slot 33131, the elastic side wall 33133 is expandable elastically to facilitate the installation of the first position limiting ring 33332 in the first position limiting ring slot 33131. After installation, the elastic side wall 33133 is restored and stops the first position limiting ring 33332 in the first position limiting ring slot 33131. The stator winding part 332 includes a winding installation housing 33201 and a metal winding 33202. The winding installation housing is provided with a winding installation slot 33203 and a sleeving opening 33204. The winding installation housing is sleeved on the installation column through the sleeving opening, and the metal winding is arranged in the winding installation slot. Specifically, the winding installation housing is a plastic winding installation housing.

In this embodiment, the driving motor 33 is connected to the oil pumping housing 32 through hot melting. An outer side wall of the driving motor 33 is provided with a protruding first rib 336, an inner side wall of the oil pumping housing 32 is provided with a first groove 321, and the first rib 336 is connected to a side wall of the first groove 321 through hot melting. Alternatively, an outer side wall of the driving motor 33 is provided with a first groove 321, an inner side wall of the oil pumping housing 32 is provided with a protruding first rib 336, and the first rib 336 is connected to a side wall of the first groove 321 through hot melting. Through the above structure, since the first rib 336 and the side wall of the first groove 321 are connected through hot melting, the driving motor 33 is connected to the oil pumping housing 32, which not only makes the connection between the driving motor 33 and the oil pumping housing 32 more stable, but also eliminates the need for an installation structure between the driving motor 33 and the oil pumping housing 32, thereby effectively reducing the size of the oil pumping housing 32, so that the oil pumping housing 32 can extend into a barrel opening of an oil barrel to pump the oil inside the oil barrel. Moreover, the driving motor 33 and the oil pumping housing 32 are connected through hot melting, which can prevent the shaking between the driving motor 33 and the oil pumping housing 32, effectively reduce the power loss of the driving motor 33, and improve the working efficiency of the driving motor 33.

In this embodiment, the oil pump further includes a control box 5. The control box 5 is internally provided with a rechargeable battery 51 and a control motherboard 52. The control box 5 is connected to the oil conveying pipeline 2, and the control motherboard 52 and the battery 51 are electrically connected to the driving motor 33. The control motherboard 52 is used for controlling a working status of the driving motor 33. The oil pump further includes an electrical connection wire 53. The control motherboard 52 is electrically connected to the driving motor 33 through the electrical connection wire 53. The electrical connection wire 53 is electrically connected to the driving motor 33 through the first liquid channel 2001. Through the above structure, since the electrical connection wire 53 electrically connects the driving motor 33 to the control motherboard 52 through the first liquid channel 2001, compared with an exposed electrical connection wire 53, the oil conveying pipeline 2 can effectively protect the electrical connection wire 53, and make the electrical connection wire 53 and the oil conveying pipeline 2 more organized, thereby making it easier for a user to use and store the oil pump.

In this embodiment, the oil conveying pipeline 2 includes a first connecting pipe 21, a second connecting pipe 22, and a straight-through pipe 23. A first end of the first connecting pipe 21 is detachably connected to the oil pumping part 3, and a second end of the first connecting pipe 21 is detachably connected to a first end of the straight-through pipe 23. A first end of the second connecting pipe 22 is detachably connected to the oil outlet part 1, and a second end of the second connecting pipe 22 is detachably connected to a second end of the straight-through pipe 23. A first penetrating opening 54 is defined in the control box 5. The straight-through pipe 23 is configured for penetrating through the first penetrating opening 54. The control box 5 includes a first housing 501 and a second housing 502. The first housing 501 and the second housing 502 are detachably connected. The straight-through pipe 23 is provided with a first position limiting plate 237 and a second position limiting plate 238. An inner wall of the first housing 501 abuts against the first position limiting plate 237, and an inner wall of the second housing 502 abuts against the second position limiting plate 238, so as to stop the straight-through pipe 23 in the first penetrating opening 54. Specifically, a first wire threading opening 231 is defined in the straight-through pipe 23. A flexible first sealing rubber sleeve 232 is provided inside the first wire threading opening 231. A second wire threading opening 2321 is defined in the first sealing rubber sleeve 232. An outer wall of the first sealing rubber sleeve 232 is pressed and sealed against an inner wall of the first wire threading opening 231. An inner wall of the second wire threading opening 2321 is used for pressing and sealing against an outer side surface of the electrical connection wire 53. The control box 5 is equipped with a first stop wall 503. The first stop wall 503 abuts against the first sealing rubber sleeve 232. The first stop wall 503 is configured for stopping the first sealing rubber sleeve 232 in the first wire threading opening 231. Through the above structure, the connection between the control box 5 and the straight-through pipe 23 is effectively achieved, and the electrical connection wire electrically connects the control motherboard to the driving motor through the second wire threading opening and the first liquid channel. Since the first wire threading opening 231 is provided with the first sealing rubber sleeve 232, oil can be prevented from seeping into the control box 5 through the first wire threading opening 231 and the second wire threading opening 2321, thereby improving the service life and safety of the oil pump.

In this embodiment, the oil pump further includes a first connecting sleeve 24 and a first locking sleeve 25. The first connecting pipe 21 is sleeved on the first end of the straight-through pipe 23, and the first connecting sleeve 24 is detachably sleeved on the first connecting pipe 21. The first locking sleeve 25 is detachably sleeved on the first connecting sleeve 24, and an inner side wall of the first locking sleeve 25 presses against an outer side wall of the first connecting sleeve 24, so that an inner side wall of the first connecting sleeve 24 presses and compresses a side wall of the first connecting pipe 21 against the straight-through pipe 23. The first connecting sleeve 24 is provided with a first position limiting groove 241. The first locking sleeve 25 is provided with a first position limiting protrusion 251. The first position limiting groove 241 is connected to the first position limiting protrusion 251. The first connecting sleeve 24 includes a first upper half part 242 and a first lower half part 243. The first locking sleeve 25 is configured for pressing the first upper half part 242 onto the first lower half part 243. The first end of the straight-through pipe 23 is provided with a first annular groove 233. A first sealing ring 234 is provided between the first connecting pipe 21 and the straight-through pipe 23. The first sealing ring 234 is positioned inside the first annular groove 233. The first upper half part 242 and the first lower half part 243 are both provided with positioning protrusions 2421. A positioning groove 2422 is defined in the oil conveying pipeline. The positioning protrusion is connected to the positioning groove. Through the above structure, the connection between the first connecting pipe 21 and the straight-through pipe 23 is effectively achieved. After the first connecting pipe 21 is sleeved on the straight-through pipe 23, the first upper half part 242 and the first lower half part 243 are sleeved on the first connecting pipe 21, so that the positioning protrusion is connected to the positioning groove. Moreover, the first upper half part 242 is pressed against the first lower half part 243 by the first locking sleeve 25, so that a side wall of the oil conveying pipeline is pressed and compressed against the straight-through pipe 23 by the first upper half part 242 and the first lower half part 243. Moreover, since the first sealing ring 234 is provided between the first connecting pipe 21 and the straight-through pipe 23, oil leakage can be effectively prevented at a connection area between the first connecting pipe 21 and the straight-through pipe 23. The first sealing ring 234 is a first silicone sealing ring or a first rubber sealing ring.

In this embodiment, the oil pump further includes a second connecting sleeve 26 and a second locking sleeve 27. The second connecting pipe 22 is sleeved on the second end of the straight-through pipe 23. The second connecting sleeve 26 is detachably sleeved on the second connecting pipe 22. The second locking sleeve 27 is detachably sleeved on the second connecting sleeve 26. An inner side wall of the second locking sleeve 27 presses against an outer side wall of the second connecting sleeve 26, so that an inner side wall of the second connecting sleeve 26 presses and compresses a side wall of the second connecting pipe 22 against the straight-through pipe 23. A second position limiting groove 261 is defined in the second connecting sleeve 26. The second locking sleeve 27 is provided with a second position limiting protrusion 271. The second position limiting groove 261 is connected to the second position limiting protrusion 271. The second connecting sleeve 26 includes a second upper half part 262 and a second lower half part 263. The second locking sleeve 27 is configured for pressing the second upper half part 262 onto the second lower half part 263. The second end of the straight-through pipe 23 is provided with a second annular groove 235. A second sealing ring 236 is provided between the second connecting pipe 22 and the straight-through pipe 23. The second sealing ring 236 is positioned inside the second annular groove 235. The oil pump further includes a third connecting sleeve 28 and a third locking sleeve 29. The first connecting pipe 21 is sleeved on one end of the oil pumping part 3. The third connecting sleeve 28 is detachably sleeved on the first connecting pipe 21. The third locking sleeve 29 is detachably sleeved on the third connecting sleeve 28. An inner side wall of the third locking sleeve 29 is configured for pressing against an outer side wall of the third connecting sleeve 28, so that an inner side wall of the third connecting sleeve 28 presses and compresses a side wall of the first connecting pipe 21 against the oil pumping part 3. A third position limiting groove 281 is defined in the third connecting sleeve 28. The third locking sleeve 29 is provided with a third position limiting protrusion 291. The third position limiting groove 281 is connected to the third position limiting protrusion 291. The third connecting sleeve 28 includes a third upper half part 282 and a third lower half part 283. The third locking sleeve 29 is configured for pressing the third upper half part 282 onto the third lower half part 283. A third annular groove 34 is defined in one end of the oil pumping part 3. A third sealing ring 341 is provided between the first connecting pipe 21 and the oil pumping part 3. The third sealing ring 341 is positioned inside the third annular groove 34. The oil pump further includes a fourth connecting sleeve 20 and a fourth locking sleeve 30. The second connecting pipe 22 is sleeved on one end of the oil outlet part 1. The fourth connecting sleeve 20 is detachably sleeved on the second connecting pipe 22. The fourth locking sleeve 30 is detachably sleeved on the fourth connecting sleeve 20. An inner side wall of the fourth locking sleeve 30 is configured for pressing against an outer side wall of the fourth connecting sleeve 20, so that an inner side wall of the fourth connecting sleeve 20 presses and compresses the side wall of the second connecting pipe 22 against the oil outlet part 1. A fourth position limiting groove 201 is defined in the fourth connecting sleeve 20. The fourth locking sleeve 30 is provided with a fourth position limiting protrusion 301. The fourth position limiting groove 201 is connected to the fourth position limiting protrusion 301. The fourth connecting sleeve 20 includes a fourth upper half part 202 and a fourth lower half part 203. The fourth locking sleeve 30 is configured for pressing the fourth upper half part 202 onto the fourth lower half part 203. A fourth annular groove 12 is defined in one end of the oil outlet part 1. A fourth sealing ring 121 is provided between the second connecting pipe 22 and the oil outlet part 1. The fourth sealing ring 121 is positioned inside the fourth annular groove 12. Through the above structure, the connection between the second connecting pipe 22 and the straight-through pipe 23, the connection between the first connecting pipe 21 and the oil pumping part 3, and the connection between the second connecting pipe 22 and the oil outlet part 1 are effectively achieved. Moreover, due to the second sealing ring 236 provided between the second connecting pipe 22 and the straight-through pipe 23, oil leakage can be effectively prevented at a connection area between the second connecting pipe 22 and the straight-through pipe 23. The second sealing ring 236 is a second silicone sealing ring or a second rubber sealing ring. Moreover, due to the third sealing ring 341 provided between the first connecting pipe 21 and the oil pumping part 3, oil leakage can be effectively prevented at a connection area between the first connecting pipe 21 and the oil pumping part 3. The third sealing ring 341 is a third silicone sealing ring or a third rubber sealing ring. Moreover, due to the fourth sealing ring 121 provided between the second connecting pipe 22 and the oil outlet part 1, oil leakage can be effectively prevented at a connection area between the second connecting pipe 22 and the oil outlet part 1. The fourth sealing ring 121 is a fourth silicone sealing ring or a fourth rubber sealing ring.

In this embodiment, the oil outlet part 1 is provided with an oil outlet housing 13. The oil outlet opening 11 is defined in the oil outlet housing 13. The oil pump further includes an infrared liquid level sensor 6. The infrared liquid level sensor 6 is connected to the oil outlet housing 13. The oil outlet opening 11 is defined in an end wall of the oil outlet housing 13. A side wall of the oil outlet housing 13 is provided with a liquid level detection opening 131. The infrared liquid level sensor 6 is provided with an infrared sensing head 61. The infrared sensing head 61 is oriented towards the liquid level detection opening 131. Specifically, the infrared liquid level sensor 6 includes a transparent first installation housing 62 and an infrared sensing head 61. The first installation housing 62 is connected to the oil outlet housing 13. A first installation opening 621 is defined in the first installation housing 62. The infrared sensor head 61 is arranged inside the first installation housing 62 through the first installation opening 621. The oil pump further includes a sealing plug 63. The sealing plug 63 is configured for sealing and covering the first installation opening 621. A third wire threading opening 631 is defined in the sealing plug 63. The infrared liquid level sensor 6 is electrically connected to the control motherboard 52 through the third wire threading opening 631. A side wall of the sealing plug 63 is pressed and sealed against a side wall of the first installation opening 621. An inner wall of the third wire threading opening 631 is used for pressing and sealing against an outer surface of the electrical connection wire 53. Through the above structure, due to the connection between the infrared liquid level sensor 6 and the oil outlet housing 13, when the oil outlet housing 13 is inserted into the vehicle's oil tank to refuel the vehicle, the infrared liquid level sensor 6 is capable of detecting a liquid level in the oil tank. When the liquid level in the oil tank reaches a preset liquid level, the control motherboard 52 controls the driving motor 33 to stop working, so as to stop the oil outlet opening 11 of the oil outlet housing 13 from discharging oil. Moreover, since the liquid level detection opening 131 is defined in the side wall of the oil outlet housing 13, the infrared liquid level sensor 6 is provided with the infrared sensing head 61, and the infrared sensing head 61 is oriented towards the liquid level detection opening 131, the oil in the vehicle's oil tank can be prevented from splashing to the liquid level detection opening 131 to cause false detection of the infrared liquid level sensor 6. For example, after the oil flowing out of the oil outlet opening 11 enters the oil tank, the oil in the oil tank is easily splashed after being impacted. If the liquid level detection opening 131 is defined in the end wall of the oil outlet housing 13, the splashed oil will enter the liquid level detection opening 131, causing the infrared liquid level sensor 6 to make false detection. Defining the liquid level detection opening 131 in the side wall of the oil pumping housing 32 can effectively prevent such false detection from occurring. Furthermore, since the oil pump further includes the sealing plug 63, the sealing plug 63 is configured for sealing and covering the first installation opening 621. The third wire threading opening 631 is defined in the sealing plug 63. The infrared liquid level sensor 6 is electrically connected to the control motherboard 52 through the third wire threading opening 631. The side wall of the sealing plug 63 is pressed and sealed against the side wall of the first installation opening 621. The inner wall of the third wire threading opening 631 is used for pressing and sealing against the outer surface of the electrical connection wire 53, which can prevent oil from penetrating into the first installation housing 62 through the first installation opening 621 and the third wire threading opening 631, thereby preventing the infrared sensing head 61 from short circuiting and greatly improving the service life of the infrared liquid level sensor 6. The infrared liquid level sensor 6 is electrically connected to the control motherboard 52 through the electrical connection wire 53. The electrical connection wire 53 is electrically connected to the infrared liquid level sensor 6 through the third wire threading opening 631 and the first liquid channel 2001.

In this embodiment, the oil pumping housing 32 is provided with an installation cavity body 323. The infrared liquid level sensor 6 is positioned inside the installation cavity body 323. A side wall of the installation cavity body 323 is provided with an elastic first clamping wall 3231 and an elastic second clamping wall 3232. A first clamping slot 3233 is surrounded and formed between the first clamping wall 3231 and the second clamping wall 3232. The infrared liquid level sensor 6 is provided with an installation protrusion 64. The first clamping wall 3231 and the second clamping wall 3232 are configured for stopping the installation protrusion 64 in the first clamping slot 3233. Through the above structure, the design is reasonable, and the structure is simple. The first clamping wall 3231 and the second clamping wall 3232 are configured for stopping the installation protrusion 64 in the first clamping slot 3233, effectively achieving the installation of the infrared liquid level sensor 6.

In this embodiment, a side wall of the control box 5 is provided with connecting buckles 55, and also includes a tightening rope 56. The tightening rope 56 is connected to the connecting buckle 55, so that a tightening space 57 is surrounded and formed between the tightening rope 56 and the side wall of the control box 5. The tightening space 57 is used for tightening the control box 5 and the straight-through pipe 23 to a barrel opening of an oil barrel. The tightening rope 56 is an elastic tightening rope 56. Through the above structure, the oil pumping housing 32 is capable of extending into the oil barrel through the barrel opening, and the tightening rope 56 tightens the control box 5 and the straight-through pipe 23 to the barrel opening of the oil barrel to fix the oil pumping part 3 to the oil barrel, so that the oil pump can continuously pump oil from the oil barrel. A total number of the connecting buckles 55 is two, and the two connecting buckles 55 are respectively connected to two ends of the tightening rope 56.

In this embodiment, a side wall of the control box 5 is also provided with a hanging buckle 58. The oil pump further includes a flexible hanging rope 14. One end of the hanging rope 14 is connected to the oil outlet part 1, and an opposite end of the hanging rope is equipped with an oil cover 141. The oil cover 141 is configured for disassembly covering the oil outlet opening 11. The hanging buckle 58 is used for hanging the hanging rope 14. Through the above structure, after the use of the oil pump is completed, the oil outlet opening 11 can be covered with the oil cover 141 to prevent oil leakage from the oil outlet opening 11. Moreover, the hanging rope 14 can be hung on the hanging buckle 58 for the user to store, carry, and transport the oil pump. A side wall of the oil outlet part 1 is also provided with a rope threading opening 142. The hanging rope 14 is connected to the rope threading opening 142. Specifically, the oil cover 141 is a silicone oil cover 141 or a rubber oil cover 141.

In this embodiment, the oil conveying pipeline 2 is a transparent oil conveying pipeline 2. Alternatively, the oil conveying pipeline 2 is a polyethylene (PE) oil conveying pipeline 2 or a rubber oil conveying pipeline 2. Alternatively, the oil conveying pipeline 2 is a flexible oil conveying pipeline 2. Through the above structure, the transparent oil conveying pipeline 2 can facilitate the user to observe the flow of oil inside the pipeline 2. The polyethylene oil conveying pipeline 2 or the rubber oil conveying pipeline 2 is more lightweight and has a longer service life. Specifically, the flexible oil conveying pipeline 2 allows easy bending by the user, so as to adjust positions of the oil outlet part 1 and the oil pumping part 3. Furthermore, a surface of the oil conveying pipeline 2 is provided with a plurality of raised annular patterns 2011. Recessed annular indentations 2012 are defined between the plurality of raised annular patterns 2011. The oil conveying pipeline 2 can be bent along the annular indentations 2012.

In this embodiment, a width of the driving motor 33 is in a range from 20 mm to 22 mm. A width of the oil pumping housing 32 is greater than or equal to the width of the driving motor 33, and the width of the oil pumping housing 32 is less than or equal to 27 mm. Through the above structure, head delivery (e.g., efficient pumphead) of the driving motor 33 with the width from 20 mm to 22 mm can meet the user's demand for the oil pump. Moreover, due to the width of the oil pump housing 32 being less than or equal to 27 mm, it can ensure that the user can insert the oil pump housing 32 into most oil barrels. For example, in Europe and United States of America, the minimum diameter of a barrel opening of a standard oil barrel is 28 mm, and the oil pump housing 32 with the width less than or equal to 27 mm can be easily inserted into the barrel opening of the standard oil barrel, thereby greatly improving the versatility of the oil pump.

In this embodiment, the control box 5 is provided with a first charging interface 59 and a second charging interface 591. Both the first charging interface 59 and the second charging interface 591 are electrically connected to the battery 51. The first charging interface 59 and the second charging interface 591 are different types of charging ports. The first charging interface 59 is a first USB charging interface, and the second charging interface 591 is a second vehicle-mounted cigarette lighter charging interface. The oil pump is also provided with a charging detection circuit 592. The charging detection circuit 592 is electrically connected to the control motherboard 52 and the battery 51. When the charging detection circuit 592 detects that the battery 51 is charged via the first charging interface 59 or the second charging interface 591, the control motherboard 52 turns off the driving motor 33. A boost module 593 is also arranged between the driving motor 33 and the battery 51. The boost module 593 is used for increase a voltage of the battery 51 and output the voltage to the driving motor 33. The control box 5 is equipped with a switch button 594. The switch button 594 is electrically connected to the control motherboard 52. The switch button 594 is used for starting or shutting down the driving motor 33. The oil pump further includes a slow start circuit 595. The slow start circuit 595 is electrically connected to the control motherboard 52. When the switch button 594 starts the driving motor 33, the slow start circuit 595 controls the driving motor 33 to gradually increase from a lowest rotational speed value to a highest rotational speed value within a preset time. The control box 5 is equipped with a battery level indicator light 596 and a working status indicator light 597. Both the battery level indicator light 596 and the working status indicator light 597 are electrically connected to the control motherboard 52 and the battery 51. The battery level indicator light 596 is used for displaying a battery level of the battery 51. The working status indicator light 597 is used for displaying the working status of the driving motor 33. The control box 5 is also provided with a handle 598. The oil pump further includes a voltage detection circuit 599. When the voltage detection circuit 599 detects that an operating voltage value of the driving motor 33 is greater than a preset voltage value, the control motherboard 52 controls the driving motor 33 to stop working, and the control motherboard 52 restarts the driving motor 33 within the preset time. Through the above structure, since the first charging interface 59 and the second charging interface 591 are different types of charging ports, it is convenient for the user to choose different charging methods to charge the oil pump. Moreover, due to the arrangement of the charging detection circuit 592, the oil pump can be prevented from working while charging, thereby effectively protecting the battery 51 and the driving motor 33, and greatly extending the service life of the oil pump. Furthermore, due to the slow start circuit 595, when the switch button 594 starts the driving motor 33, the slow start circuit 595 controls a voltage of the driving motor 33 to gradually increase, thereby achieving an effect of slow start, so that the driving motor 33 gradually increases from the lowest rotational speed value to the highest rotational speed value within the preset time. Specifically, after the driving motor 33 is started for 1-2 seconds, a rotational speed of the driving motor 33 gradually increases from 0 to 16000 revolutions per minute. Furthermore, since the control box 5 is equipped with the battery level indicator light 596 and the working status indicator light 597, it is convenient for the user to observe the battery level and working status of the oil pump, such as whether the oil pump is started or stopped. Furthermore, since the control box 5 is provided with the handle 598, it is convenient for the user to take the control box 5 and press the switch button 594. Furthermore, due to the arrangement of the voltage detection circuit 599, when the voltage detection circuit 599 detects that the operating voltage value of the driving motor 33 is greater than the preset voltage value, the control motherboard 52 controls the driving motor 33 to stop working, and the control motherboard 52 restarts the driving motor 33 within the preset time, so as to protect the driving motor 33 and the battery 51, prevent the oil pump from burning out due to overvoltage, and restart the driving motor 33 within the preset time, without requiring the user to repeatedly operate the switch button 594.

In this embodiment, the first oil pumping opening 31 is defined in the oil pumping housing 32. The oil pump further includes a first end cover 7 and first support columns 71. The first end cover 7 is configured for covering the first oil pumping opening 31. The first end cover 7 is provided with a second oil pumping opening 72 in communication with the first oil pumping opening 31. The first support column 71 is provided with a first end 711 and a second end 712. The first end 711 of the first support column 71 is connected to the first end cover 7. The first support column 71 is used for supporting the first end cover 7. A spacing is defined between the second end 712 of the first support column 71 and the second oil pumping opening 72. A total number of the first support columns 71 is multiple. The plurality of first support columns 71 are arranged around the second oil pumping opening 72. Specifically, a second position limiting ring slot 73 is defined in the first end cover 7, the oil pumping housing 32 is provided with a second position limiting ring 322, and the second position limiting ring 322 is positioned within the second position limiting ring slot 73. Alternatively, the first end cover 7 is provided with a second position limiting ring 322, a second position limiting ring slot 73 is defined in the oil pumping housing 32, and the second position limiting ring 322 is positioned within the second position limiting ring slot 73. Through the above structure, the first support column 71 is used for supporting the first end cover 7, and the spacing is defined between the second end 712 of the first support column 71 and the second oil pumping opening 72, so that the first support column 71 supports the second oil pumping opening 72 and the first oil pumping opening 31, so as to maintain a certain spacing between the second oil pumping opening 72 and the first oil pumping opening 31 and an inner wall of the oil barrel, thereby preventing the inner wall of the oil barrel from covering the second oil pumping opening 72 and the first oil pumping opening 31, and allowing the oil pump to smoothly pump oil from the oil barrel.

In this embodiment, the oil pump further includes a sealing rubber plug. The sealing rubber plug 9000 is connected to the control box, and the sealing rubber plug is configured for detachably covering the first charging interface and the second charging interface.

The above description only describes embodiments of the present disclosure, and is not intended to limit the present disclosure; various modifications and changes can be made to the present disclosure. Any modifications, equivalent substitutions, and improvements made within the spirit and scope of the present disclosure are intended to be included within the scope of the present disclosure.

What is claimed is:

1. An oil pump, comprising:
an oil outlet part, wherein an oil outlet opening is defined in the oil outlet part;
a hollow oil conveying pipeline, wherein the oil conveying pipeline is provided with a first liquid channel;
an oil pumping part, wherein a first oil pumping opening is defined in the oil pumping part; the oil pumping part is connected to the oil outlet part through the oil conveying pipeline, and the oil pumping part, the oil conveying pipeline, and the oil outlet part are in communication with each other; the oil pumping part is provided with an oil pumping housing and a driving motor, the driving motor is positioned inside the oil pumping housing, the driving motor is connected to the oil pumping housing, and the driving motor is used for driving oil to pass through the first oil pumping opening, the first liquid channel, and the oil outlet opening in sequence and flow out through the oil outlet opening; the driving motor is a brushless motor, the brushless motor comprises a motor housing, a stator winding part, and a permanent magnet rotor part, the motor housing is provided with a partition part, and the partition part is configured for dividing the motor housing into a first installation cavity and a second installation cavity; a first opening is defined in the first installation cavity, a second opening is defined in the second installation cavity, the stator winding part is installed in the first installation cavity through the first opening, and the permanent magnet rotor part is installed in the second installation cavity through the second opening; and a sealing part, wherein the sealing part is configured for sealing and covering the first opening to seal the first installation cavity;

wherein the sealing part is an epoxy resin sealing part; and the epoxy resin sealing part is formed by pouring epoxy resin into the first opening and then curing the epoxy resin.

2. The oil pump according to claim 1, further comprising a control box, wherein the control box is internally provided with a rechargeable battery and a control motherboard; the control box is connected to the oil conveying pipeline; the control motherboard and the battery are electrically connected to the driving motor; and the control motherboard is used for controlling a working status of the driving motor.

3. The oil pump according to claim 2, further comprising an electrical connection wire, wherein the control motherboard is electrically connected to the driving motor through the electrical connection wire; and the electrical connection wire is electrically connected to the driving motor through the first liquid channel.

4. The oil pump according to claim 2, wherein the oil conveying pipeline comprises a first connecting pipe, a second connecting pipe, and a straight-through pipe; a first end of the first connecting pipe is detachably connected to the oil pumping part; a second end of the first connecting pipe is detachably connected to a first end of the straight-through pipe; a first end of the second connecting pipe is detachably connected to the oil outlet part; and a second end of the second connecting pipe is detachably connected to a second end of the straight-through pipe.

5. The oil pump according to claim 4, wherein a first penetrating opening is defined in the control box; the straight-through pipe is configured for penetrating through the first penetrating opening; the control box comprises a first housing and a second housing; the first housing and the second housing are detachably connected; the straight-through pipe is provided with a first position limiting plate and a second position limiting plate; an inner wall of the first housing abuts against the first position limiting plate; and an inner wall of the second housing abuts against the second position limiting plate, so as to stop the straight-through pipe in the first penetrating opening.

6. The oil pump according to claim 4, wherein a first wire threading opening is defined in the straight-through pipe; a flexible first sealing rubber sleeve is provided inside the first wire threading opening; a second wire threading opening is defined in the first sealing rubber sleeve; an outer wall of the first sealing rubber sleeve is pressed and sealed against an inner wall of the first wire threading opening; an electrical connection wire electrically connects the control motherboard to the driving motor through the second wire threading opening and a first liquid channel; and an inner wall of the second wire threading opening is used for pressing and sealing against an outer side surface of the electrical connection wire.

7. The oil pump according to claim 4, further comprising a first connecting sleeve and a first locking sleeve, wherein the first connecting pipe is sleeved on the first end of the straight-through pipe; the first connecting sleeve is detachably sleeved on the first connecting pipe; the first locking sleeve is detachably sleeved on the first connecting sleeve; and an inner side wall of the first locking sleeve presses against an outer side wall of the first connecting sleeve, so that an inner side wall of the first connecting sleeve presses and compresses a side wall of the first connecting pipe against the straight-through pipe.

8. The oil pump according to claim 7, wherein the first connecting sleeve is provided with a first position limiting groove; the first locking sleeve is provided with a first position limiting protrusion; the first position limiting groove is connected to the first position limiting protrusion; the first connecting sleeve comprises a first upper half part and a first lower half part; the first locking sleeve is configured for pressing the first upper half part onto the first lower half part; the first end of the straight-through pipe is provided with a first annular groove; a first sealing ring is provided between the first connecting pipe and the straight-through pipe; and the first sealing ring is positioned inside the first annular groove.

9. The oil pump according to claim 4, wherein a side wall of a control box is provided with connecting buckles, and also comprises a tightening rope; the tightening rope is connected to the connecting buckle, so that a tightening space is surrounded and formed between the tightening rope and the side wall of the control box; the tightening space is used for tightening the control box and the straight-through pipe to a barrel opening of an oil barrel; a side wall of the control box is also provided with a hanging buckle; the oil pump further comprises a flexible hanging rope; one end of the hanging rope is connected to the oil outlet part; an opposite end of the hanging rope is equipped with an oil cover; the oil cover is configured for disassembly covering the oil outlet opening; and the hanging buckle is used for hanging the hanging rope.

10. The oil pump according to claim 1, wherein the oil conveying pipeline is a transparent oil conveying pipeline; alternatively, the oil conveying pipeline is a polyethylene oil conveying pipeline or a rubber oil conveying pipeline; alternatively, the oil conveying pipeline is a flexible oil conveying pipeline.

11. The oil pump according to claim 1, wherein a width of the driving motor is in a range from 20 mm to 22 mm; a width of the oil pumping housing is greater than or equal to the width of the driving motor; and the width of the oil pumping housing is less than or equal to 27 mm.

12. The oil pump according to claim 2, wherein the control box is provided with a first charging interface and a second charging interface; both the first charging interface and the second charging interface are electrically connected to the battery; the first charging interface and the second charging interface are different types of charging ports; the first charging interface is a first USB charging interface or a first TYPE-C charging interface; the second charging interface is a second vehicle-mounted cigarette lighter charging interface; the oil pump is also provided with a charging detection circuit; the charging detection circuit is electrically connected to the control motherboard and the battery; when the charging detection circuit detects that the battery is charged via the first charging interface or the second charging interface, the control motherboard turns off the driving motor; a boost module is also arranged between the driving motor and the battery; the boost module is used for increase a voltage of the battery and output the voltage to the driving motor; the control box is equipped with a switch button; the switch button is electrically connected to the control motherboard; the switch button is used for starting or shutting down the driving motor; the oil pump further comprises a slow start circuit; the slow start circuit is electrically connected to the control motherboard; when the switch button starts the driving motor, the slow start circuit controls the driving motor to gradually increase from a lowest rotational speed value to a highest rotational speed value within a preset time; the control box is equipped with a battery level indicator light and a working status indicator light; both the battery level indicator light and the working status indicator light are electrically connected to the control motherboard and the battery; the battery level indicator light is used for displaying a battery level of the battery; the working status indicator light is used for displaying the working status of the driving motor; the control box is also provided with a handle; the oil pump further comprises a voltage detection circuit; when the voltage detection circuit detects that an operating voltage value of the driving motor is greater than a preset voltage value, the control motherboard controls the driving motor to stop working, and the control motherboard restarts the driving motor within the preset time.

13. An oil pump, comprising:
an oil outlet part, wherein an oil outlet opening is defined in the oil outlet part;
a hollow oil conveying pipeline, wherein the oil conveying pipeline is provided with a first liquid channel;
an oil pumping part, wherein a first oil pumping opening is defined in the oil pumping part: the oil pumping part is connected to the oil outlet part through the oil conveying pipeline, and the oil pumping part, the oil conveying pipeline, and the oil outlet part are in communication with each other; the oil pumping part is provided with an oil pumping housing and a driving motor, the driving motor is positioned inside the oil pumping housing, the driving motor is connected to the oil pumping housing, and the driving motor is used for driving oil to pass through the first oil pumping opening, the first liquid channel, and the oil outlet opening in sequence and flow out through the oil outlet opening: the driving motor is a brushless motor, the brushless motor comprises a motor housing, a stator winding part, and a permanent magnet rotor part, the motor housing is provided with a partition part, and the partition part is configured for dividing the motor housing into a first installation cavity and a second installation cavity: a first opening is defined in the first installation cavity, a second opening is defined in the second installation cavity, the stator winding part is installed in the first installation cavity through the first opening, and the permanent magnet rotor part is installed in the second installation cavity through the second opening; and
a sealing part, wherein the sealing part is configured for sealing and covering the first opening to seal the first installation cavity;

wherein the permanent magnet rotor part comprises a permanent magnet rotor and an impeller; the permanent magnet rotor is arranged in the second installation cavity through the second opening; the impeller is connected to the permanent magnet rotor; the first installation cavity is internally equipped with a protruding installation column; the stator winding part is sleeved on the installation column; the stator winding part comprises a winding installation housing and a metal winding; the winding installation housing is provided with a winding installation slot and a sleeving opening; the winding installation housing is sleeved on the installation column through the sleeving opening; and the metal winding is arranged in the winding installation slot.

14. The oil pump according to claim 13, further comprising a rotor installation housing, wherein the rotor installation housing is connected to an inner side wall of the second installation cavity; the rotor installation housing is configured for preventing an axial movement of the permanent magnet rotor in the second installation cavity; a third opening is defined in the rotor installation housing; the permanent magnet rotor also comprises a connecting shaft; the connecting shaft penetrates out of the second installation cavity through the third opening and is connected to the impeller; an outer side wall of the rotor installation housing is provided with a first position limiting ring; the inner side wall of the second installation cavity is provided with a first position limiting ring slot; the first position limiting ring is positioned inside the first position limiting ring slot; a side wall of the second installation cavity is provided with slits and elastic side walls formed between the slits; the first position limiting ring slot is defined in the elastic side wall; the installation column is a hollow installation column; the stator winding part is sleeved on an outer surface of the installation column; an inner surface of the installation column is provided with a concave first installation slot; one end of the connecting shaft is inserted into the first installation slot; an opposite end of the connecting shaft penetrates out of the second installation cavity through the third opening and is connected to the impeller; a first bearing sleeve is provided between the connecting shaft and the third opening; a second bearing sleeve is provided between the connecting shaft and the first installation slot; the oil pump further comprises an installation sleeve; the installation sleeve is sleeved on the outer surface of the installation column; the installation sleeve is provided with a first wire clamping wall and a second wire clamping wall; a wire clamping slot is formed between the first wire clamping wall and the second wire clamping wall; and the first wire clamping wall and the second wire clamping wall are used for clamping an electrical connection wire in the wire clamping slot.

15. An oil pump, comprising:
an oil outlet part, wherein an oil outlet opening is defined in the oil outlet part;
a hollow oil conveying pipeline, wherein the oil conveying pipeline is provided with a first liquid channel;
an oil pumping part, wherein a first oil pumping opening is defined in the oil pumping part; the oil pumping part is connected to the oil outlet part through the oil conveying pipeline, and the oil pumping part, the oil conveying pipeline, and the oil outlet part are in communication with each other: the oil pumping part is provided with an oil pumping housing and a driving motor, the driving motor is positioned inside the oil pumping housing, the driving motor is connected to the oil pumping housing, and the driving motor is used for driving oil to pass through the first oil pumping opening, the first liquid channel, and the oil outlet opening in sequence and flow out through the oil outlet opening; the driving motor is a brushless motor, the brushless motor comprises a motor housing, a stator winding part, and a permanent magnet rotor part, the motor housing is provided with a partition part, and the partition part is configured for dividing the motor housing into a first installation cavity and a second installation cavity; a first opening is defined in the first installation cavity, a second opening is defined in the second installation cavity, the stator winding part is installed in the first installation cavity through the first opening, and the permanent magnet rotor part is installed in the second installation cavity through the second opening; and a sealing part, wherein the sealing part is configured for sealing and covering the first opening to seal the first installation cavity;

wherein the driving motor is connected to the oil pumping housing through hot melting.

16. The oil pump according to claim 15, wherein an outer side wall of the driving motor is provided with a protruding first rib, an inner side wall of the oil pumping housing is provided with a first groove, and the first rib is connected to a side wall of the first groove through hot melting; alternatively, an outer side wall of the driving motor is provided with a first groove, an inner side wall of the oil pumping housing is provided with a protruding first rib, and the first rib is connected to a side wall of the first groove through hot melting.

17. An oil pump, comprising:

an oil outlet part, wherein an oil outlet opening is defined in the oil outlet part;

a hollow oil conveying pipeline, wherein the oil conveying pipeline is provided with a first liquid channel;

an oil pumping part, wherein a first oil pumping opening is defined in the oil pumping part; the oil pumping part is connected to the oil outlet part through the oil conveying pipeline, and the oil pumping part, the oil conveying pipeline, and the oil outlet part are in communication with each other; the oil pumping part is provided with an oil pumping housing and a driving motor, the driving motor is positioned inside the oil pumping housing, the driving motor is connected to the oil pumping housing, and the driving motor is used for driving oil to pass through the first oil pumping opening, the first liquid channel, and the oil outlet opening in sequence and flow out through the oil outlet opening; the driving motor is a brushless motor, the brushless motor comprises a motor housing, a stator winding part, and a permanent magnet rotor part, the motor housing is provided with a partition part, and the partition part is configured for dividing the motor housing into a first installation cavity and a second installation cavity; a first opening is defined in the first installation cavity, a second opening is defined in the second installation cavity, the stator winding part is installed in the first installation cavity through the first opening, and the permanent magnet rotor part is installed in the second installation cavity through the second opening; and a sealing part, wherein the sealing part is configured for sealing and covering the first opening to seal the first installation cavity;

wherein the oil outlet part is provided with an oil outlet housing; the oil outlet opening is defined in the oil outlet housing; the oil pump further comprises an infrared liquid level sensor; and the infrared liquid level sensor is connected to the oil outlet housing.

18. The oil pump according to claim 17, wherein the oil outlet opening is defined in an end wall of the oil outlet housing; a side wall of the oil outlet housing is provided with a liquid level detection opening; the infrared liquid level sensor is provided with an infrared sensing head; and the infrared sensing head is oriented towards the liquid level detection opening.

19. The oil pump according to claim 17, wherein the infrared liquid level sensor comprises a transparent first installation housing and an infrared sensing head; the first installation housing is connected to the oil outlet housing; a first installation opening is defined in the first installation housing; the infrared sensor head is arranged inside the first installation housing through the first installation opening; the oil pump further comprises a sealing plug; the sealing plug is configured for sealing and covering the first installation opening; a third wire threading opening is defined in the sealing plug; the infrared liquid level sensor is electrically connected to the control motherboard through the third wire threading opening; a side wall of the sealing plug is pressed and sealed against a side wall of the first installation opening; and an inner wall of the third wire threading opening is used for pressing and sealing against an outer surface of an electrical connection wire.

* * * * *